United States Patent
Kawasaki et al.

(10) Patent No.: US 8,410,893 B2
(45) Date of Patent: Apr. 2, 2013

(54) MAGNETIC DETECTOR AND METHOD FOR MANUFACTURING THE SAME

(75) Inventors: Hideaki Kawasaki, Niigata-ken (JP); Masamichi Saito, Niigata-ken (JP); Yoshihiro Nishiyama, Niigata-ken (JP); Kenji Ichinohe, Niigata-ken (JP); Yosuke Ide, Niigata-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 0 days.

(21) Appl. No.: 13/439,782

(22) Filed: Apr. 4, 2012

(65) Prior Publication Data

US 2013/0038421 A1    Feb. 14, 2013

(30) Foreign Application Priority Data

Aug. 9, 2011 (JP) ................................. 2011-173482

(51) Int. Cl.
*H01L 43/00* (2006.01)
(52) U.S. Cl. ................. 338/32 R; 324/252; 324/207.21; 257/421

(58) Field of Classification Search ................. 338/32 R
See application file for complete search history.

(56) References Cited

U.S. PATENT DOCUMENTS

| | | | | |
|---|---|---|---|---|
| 5,038,130 | A * | 8/1991 | Eck et al. | 338/32 R |
| 5,196,821 | A * | 3/1993 | Partin et al. | 338/32 R |
| 6,326,782 | B1 * | 12/2001 | Schroeder | 324/207.21 |
| 6,335,675 | B1 * | 1/2002 | Kakinuma et al. | 338/32 R |
| 7,592,805 | B2 * | 9/2009 | Ando et al. | 324/252 |

FOREIGN PATENT DOCUMENTS

| JP | 2008-46076 | 2/2008 |
|---|---|---|
| JP | 2008-58183 | 3/2008 |

\* cited by examiner

*Primary Examiner* — Kyung Lee
(74) *Attorney, Agent, or Firm* — Beyer Law Group LLP

(57) ABSTRACT

A first short-circuit layer and a second short-circuit layer are electrically connected to and integrally stacked onto only a first magnetoresistance effect element layer and a first resistance element layer, respectively, so as to achieve short-circuiting, and thereby adjusting electrical resistances of the first magnetoresistance effect element layer and the first resistance element layer.

17 Claims, 15 Drawing Sheets

PRIOR ART

MAGNETIC DETECTOR AND METHOD FOR MANUFACTURING THE SAME

CLAIM OF PRIORITY

This application claims benefit of Japanese Patent Application No. 2011-173482 filed on Aug. 9, 2011, which is hereby incorporated by reference.

BACKGROUND OF THE INVENTION

1. Field of the Invention

The present invention relates to a magnetic detector for detecting an external magnetic field using a magnetoresistance effect element layer or the like. More specifically, the present invention relates to a magnetic detector that enables highly accurate magnetic detection by adjusting an electrical resistance value, and a method for manufacturing the magnetic detector.

2. Description of the Related Art

A magnetic detector is known. In this magnetic detector, a magnetoresistance effect element layer having an electrical resistance which changes in response to an external magnetic field is connected in series to a resistance element layer having an electrical resistance which does not change in response to an external magnetic field, a power supply voltage is applied to the magnetoresistance effect element layer and the resistance element layer, and a potential at a midpoint between the magnetoresistance effect element layer and the resistance element layer is detected, whereby an external magnetic field is detected. A magnetoresistance effect element layer having an electrical resistance which changes in response to an external magnetic field may be used as the foregoing resistance element layer.

In this type of magnetic detector, the electrical resistances of the magnetoresistance effect element layer and the resistance element layer are adjusted so that the potential at the midpoint is half the power supply voltage when there is no external magnetic field. When an external magnetic field is generated, the electrical resistance of the magnetoresistance effect element layer changes, and thereby the potential at the midpoint changes. In this way, an external magnetic field is detected by measuring a change in potential at the midpoint.

Methods for adjusting the electrical resistances of the magnetoresistance effect element layer and the resistance element layer are disclosed in Japanese Unexamined Patent Application Publications No. 2008-46076 and No. 2008-58183.

In the method for adjusting electrical resistance disclosed in Japanese Unexamined Patent Application Publication No. 2008-46076, as illustrated in FIG. 21, a plurality of current bypasses, i.e., a first current bypass 601, a second current bypass 602, and a third current bypass 603, are provided to a resistance element layer 703 having an electrical resistance which does not change in response to an external magnetic field, in a stepwise form along the longitudinal direction of the element (X2-X1 direction).

Also, a protruding region 604 that protrudes in a direction away from the resistance element layer 703 is provided in each current bypass.

When a difference in resistance value between a magnetoresistance effect element layer 701 having an electrical resistance which changes in response to an external magnetic field and the resistance element layer 703 is outside an allowable range, current paths in the protruding regions 604 are cut off in order from the protruding region 604 that protrudes the most viewed from the resistance element layer 703, and thereby the difference in resistance value is adjusted to be within the allowable range.

In this method, a plurality of protruding current bypasses are provided to the resistance element layer 703, which inhibits a reduction of the size of a magnetic detector.

In the method for adjusting electrical resistance disclosed in Japanese Unexamined Patent Application Publication No. 2008-58183, as illustrated in FIG. 22, magnetoresistance effect element layers 701 and 702 having an electrical resistance which changes in response to an external magnetic field and resistance element layers 703 and 704 having an electrical resistance which does not change in response to an external magnetic field are connected in series, respectively. Also, there are provided output conductive layers 705 and 706 that are connected to midpoints between the magnetoresistance effect element layers 701 and 702 and the resistance element layers 703 and 704, respectively, and that output potentials of the midpoints.

Each of the output conductive layers 705 and 706 extends in one longitudinal direction of the magnetoresistance effect element layers 701 and 702 and the resistance element layers 703 and 704. Each of the output conductor layers 705 and 706 is electrically connected to one of the magnetoresistance effect element layers 701 and 702 and the resistance element layers 703 and 704 via a conductive connection layer 707 or 708. In this way, the positions of the connection layers 707 and 708 are changed, so that the electrical resistance value of one of the magnetoresistance effect element layers 701 and 702 and the resistance element layers 703 and 704 is adjusted.

In the adjustment of changing the positions of the connection layers 707 and 708, a step-and-repeat exposure system (stepper), which performs exposure using a reticle by moving a substrate using a step-and-repeat method, is typically used for forming the pattern of the connection layers 707 and 708. Thus, the pattern of the connection layers 707 and 708 is formed through a plurality of exposure operations. In the plurality of exposure operations, variations in dimension and variations in alignment of the connection layers 707 and 708 occur. Accordingly, highly accurate adjustment of electrical resistance cannot be performed.

SUMMARY OF THE INVENTION

The present invention provides a compact magnetic detector capable of adjusting electrical resistance with high accuracy and a method for manufacturing the magnetic detector.

There is provided a magnetic detector including a first magnetoresistance effect element layer having an electrical resistance which changes in response to an external magnetic field, a first resistance element layer connected in series to the first magnetoresistance effect element layer, a first short-circuit layer that is conductive, serves as a short-circuit path, and adjusts electrical resistance, and a second short-circuit layer that is conductive, serves as a short-circuit path, and adjusts electrical resistance. The first short-circuit layer is electrically connected to only one of the first magnetoresistance effect element layer and the first resistance element layer and is disposed in a first certain range of the one of the first magnetoresistance effect element layer and the first resistance element layer. The second short-circuit layer is electrically connected to only the other of the first magnetoresistance effect element layer and the first resistance element layer and is disposed in a second certain range of the other of the first magnetoresistance effect element layer and the first resistance element layer. A difference between a first short-circuit length defined by the first short-circuit layer and a second short-circuit length defined by the second short-circuit layer adjusts a difference in electrical resistance between the first magnetoresistance effect element layer and the first resistance element layer.

Each of the first short-circuit layer and the second short-circuit layer is disposed in the first certain range or the second certain range in the first magnetoresistance effect element layer or the first resistance element layer, and does not protrude from the first magnetoresistance effect element layer or the first resistance element layer, which is advantageous in a reduced size.

Since the first short-circuit layer and the second short-circuit layer are positioned close to each other, variations of the difference between the first short-circuit length and the second short-circuit length are less likely to be affected variations in an exposure process. Thus, adjustment of electrical resistance performed on the basis of the difference between the first short-circuit length and the second short-circuit length is less likely to be affected by variations in an exposure process.

Each of the first short-circuit layer and the second short-circuit layer is disposed on and short-circuits one of the first magnetoresistance effect element layer and the first resistance element layer, and adjusts electrical resistance on the basis of the difference between the first short-circuit length and the second short-circuit length. Thus, the adjustment of the electrical resistance is not affected by misalignment of the first short-circuit layer and the second short-circuit layer.

Thus, according to the present invention, a compact magnetic detector capable of adjusting electrical resistance with high accuracy can be provided.

Preferably, the difference between the first short-circuit length and the second short-circuit length defines a difference in length between the first magnetoresistance effect element layer and the first resistance element layer.

With this configuration, a difference in electrical resistance between the first magnetoresistance effect element layer and the first resistance element layer can be adjusted by using the difference between the first short-circuit length and the second short-circuit length. That is, the electrical resistances of the first magnetoresistance effect element layer and the first resistance element layer can be set to be the same or to have a certain difference.

Preferably, the first resistance element layer is a first pinned resistance element layer having an electrical resistance which does not change in response to an external magnetic field.

With this configuration, a magnetic detector for detecting an external magnetic field can be configured.

Preferably, the first resistance element layer is a second magnetoresistance effect element layer having an electrical resistance which increases or decreases in response to an external magnetic field in an opposite manner to the electrical resistance of the first magnetoresistance effect element layer.

With this configuration, a magnetic detector for detecting an external magnetic field can be configured. Also, an improved output can be obtained compared to a case where the first resistance element layer is the first pinned resistance element layer having an electrical resistance which does not change in response to an external magnetic field.

Preferably, the first short-circuit layer is disposed at a certain distance from both ends in a longitudinal direction of one of the first magnetoresistance effect element layer and the first resistance element layer.

With this configuration, a negative influence of halation or the like, caused by a pattern near the both ends in the longitudinal direction, can be reduced in exposure during pattern formation of the first short-circuit layer. Accordingly, the accuracy of dimensions of the pattern of the first short-circuit layer can be enhanced.

Preferably, the second short-circuit layer is disposed at a certain distance from both ends in a longitudinal direction of the other of the first magnetoresistance effect element layer and the first resistance element layer.

With this configuration, a negative influence of halation or the like, caused by a pattern near the both ends in the longitudinal direction, can be reduced in exposure during pattern formation of the second short-circuit layer. Accordingly, the accuracy of dimensions of the pattern of the second short-circuit layer can be enhanced.

Preferably, the second short-circuit length corresponds to a sum of the first short-circuit length and a fifth short-circuit length, the fifth short-circuit length being defined by a first adjustment short-circuit layer which adjusts electrical resistance. Preferably, the fifth short-circuit length, which is a difference between the second short-circuit length and the first short-circuit length, adjusts electrical resistances of the first magnetoresistance effect element layer and the first resistance element layer. Also, preferably, the first short-circuit layer and the first adjustment short-circuit layer are connected to each other.

In the case of adjusting electrical resistance using only the fifth short-circuit length, when a difference in electrical resistance becomes very small, the fifth short-circuit length becomes very small, and the accuracy of the length of the fifth short-circuit length degrades. As a result, the accuracy of adjusting electrical resistance degrades. Thus, the pattern of the second short-circuit layer is caused to be the same as the pattern of a combination of the first short-circuit layer, which is sufficiently longer than the resolution of a stepper, and the first adjustment short-circuit layer. As a result, the first short-circuit length and the second short-circuit length are accurately obtained by the stepper, and electrical resistance is adjusted by the difference therebetween, that is, the fifth short-circuit length. Accordingly, electrical resistance can be finely adjusted.

Preferably, the first magnetoresistance effect element layer and the second magnetoresistance effect element layer have a first pinned magnetic layer in which a magnetization direction is pinned, a free magnetic layer in which a magnetization direction changes in response to an external magnetic field, and a nonmagnetic conductive layer disposed between the first pinned magnetic layer and the free magnetic layer.

With this configuration, a magnetoresistance effect element layer having an electrical resistance which changes in response to an external magnetic field and having a magnetoresistance effect can be obtained.

Preferably, the first magnetoresistance effect element layer has an electrical resistance which changes in response to a magnetic field in a first direction, and which does not change in response to a magnetic field in a second direction, the second direction being opposite to the first direction. Also, preferably, the second magnetoresistance effect element layer has an electrical resistance which changes in response to a magnetic field in the second direction, and which does not change in response to a magnetic field in the first direction.

With this configuration, the electrical resistances of the first magnetoresistance effect element layer and the second magnetoresistance effect element layer increase or decrease in response to an external magnetic field in an opposite manner. Thus, the magnetic detector including the first magnetoresistance effect element layer and the second magnetoresistance effect element layer realizes a better output than the magnetic detector including the first magnetoresistance effect element layer and the first pinned resistance element layer.

Preferably, the first pinned resistance element layer has a first pinned magnetic layer in which a magnetization direction is pinned, a nonmagnetic conductive layer having a low resistivity, and a second pinned magnetic layer disposed between the first pinned magnetic layer and the nonmagnetic conductive layer.

With this configuration, since the second pinned magnetic layer is stacked on the first pinned magnetic layer, a resistance element layer having an electrical resistance which does not change in response to an external magnetic field can be obtained. Also, the first magnetoresistance effect element layer and the first pinned resistance element layer may have the same layered structure and the same film thicknesses, and thus a change rate of electrical resistance and so forth caused by change in environmental temperature can be almost the same. Accordingly, a magnetic detector for accurately detecting an external magnetic field in response to a change in environmental temperature and so forth can be realized.

Preferably, the magnetic detector further includes a second resistance element layer that faces the first magnetoresistance effect element layer, a fourth magnetoresistance effect element layer connected in series to the second resistance element layer, a third short-circuit layer that is conductive, serves as a short-circuit path, and adjusts electrical resistance, and a fourth short-circuit layer that is conductive, serves as a short-circuit path, and adjusts electrical resistance. Preferably, the third short-circuit layer is electrically connected to and disposed on only one of the fourth magnetoresistance effect element layer and the second resistance element layer. Preferably, the fourth short-circuit layer is electrically connected to and disposed on only the other of the fourth magnetoresistance effect element layer and the second resistance element layer. Preferably, the first magnetoresistance effect element layer, the first resistance element layer, the second resistance element layer, and the fourth magnetoresistance effect element layer constitute a bridge circuit.

With this configuration, a difference between the potential at the midpoint between the first magnetoresistance effect element layer and the first resistance element layer and the potential at the midpoint between the forth magnetoresistance effect element layer and the second resistance element layer can be used as an output. Thus, the output of the magnetic detector can be improved.

There is provided a method for manufacturing a magnetic detector including a first magnetoresistance effect element layer having an electrical resistance which changes in response to an external magnetic field, a first resistance element layer connected in series to the first magnetoresistance effect element layer, a first short-circuit layer that is conductive, serves as a short-circuit path, and adjusts electrical resistance, and a second short-circuit layer that is conductive, serves as a short-circuit path, and adjusts electrical resistance. The method includes (a) a step of forming the first magnetoresistance effect element layer and the first resistance element layer, (b) a step of measuring electrical resistances of the first magnetoresistance effect element layer and the first resistance element layer, and determining a difference between the electrical resistances, the difference being caused by variations of a process, and which of the electrical resistances is higher, and (c) a step of adjusting electrical resistances of the first magnetoresistance effect element layer and the first resistance element layer by using a configuration in which the second short-circuit layer is electrically connected to only one of the first magnetoresistance effect element layer and the first resistance element layer having a higher electrical resistance and is disposed in a second certain range of the one of the first magnetoresistance effect element layer and the first resistance element layer, and in which the first short-circuit layer is electrically connected to only the other of the first magnetoresistance effect element layer and the first resistance element layer having a lower electrical resistance and is disposed in a first certain range of the other of the first magnetoresistance effect element layer and the first resistance element layer.

Each of the first short-circuit layer and the second short-circuit layer is disposed in the first certain range or the second certain range in the first magnetoresistance effect element layer or the first resistance element layer, and does not protrude from the first magnetoresistance effect element layer or the first resistance element layer, which is advantageous in a reduced size.

Since the first short-circuit layer and the second short-circuit layer are positioned close to each other, variations of the difference between the first short-circuit length and the second short-circuit length are less likely to be affected variations in an exposure process. Thus, adjustment of electrical resistance performed on the basis of the difference between the first short-circuit length and the second short-circuit length is less likely to be affected by variations in an exposure process.

Each of the first short-circuit layer and the second short-circuit layer is disposed on and short-circuits one of the first magnetoresistance effect element layer and the first resistance element layer, and adjusts electrical resistance on the basis of the difference between the first short-circuit length and the second short-circuit length. Thus, the adjustment of the electrical resistance is not affected by misalignment of the first short-circuit layer and the second short-circuit layer.

Thus, according to the present invention, a compact magnetic detector capable of adjusting electrical resistance with high accuracy can be provided.

Preferably, in the step (c), a resist is applied onto the first magnetoresistance effect element layer and the first resistance element layer, and, with the use of a reticle having individual certain patterns of the first short-circuit layer and the second short-circuit layer, the individual certain patterns are simultaneously exposed.

With this configuration, the certain patterns of the first short-circuit layer and the second short-circuit layer are simultaneously exposed by a stepper using the same resist and the same reticle. At this time, exposure is performed at a plurality of positions of a substrate by moving the substrate using a step-and-repeat method. Thus, the resist dimensions of the plurality of certain patterns shift to almost the same degree from the reticle dimensions. In this way, variations of a difference in dimensions between the first short-circuit layer and the second short-circuit layer in the plurality of exposure operations can be suppressed to be small. Also, the electrical resistances of the first magnetoresistance effect element layer and the first resistance element layer are adjusted on the basis of a difference in electrical resistance, which is determined by a difference in dimension between the first short-circuit length and the second short-circuit length. Thus, adjustment of the electrical resistances is less likely to be affected by variations in an exposure process, and the electrical resistances can be adjusted with high accuracy.

DESCRIPTION OF THE PREFERRED EMBODIMENTS

A magnetic detector according to the present invention is used as a current sensor for measuring an amount of current with high accuracy even when the amount is small. For this purpose, electrical resistances of element layers included in the magnetic detector need to be adjusted with high accuracy. The application of the present invention is not limited to a current sensor, and may be applied to a magnetic sensor, a geomagnetic sensor, or the like.

First Embodiment

Figure 1:
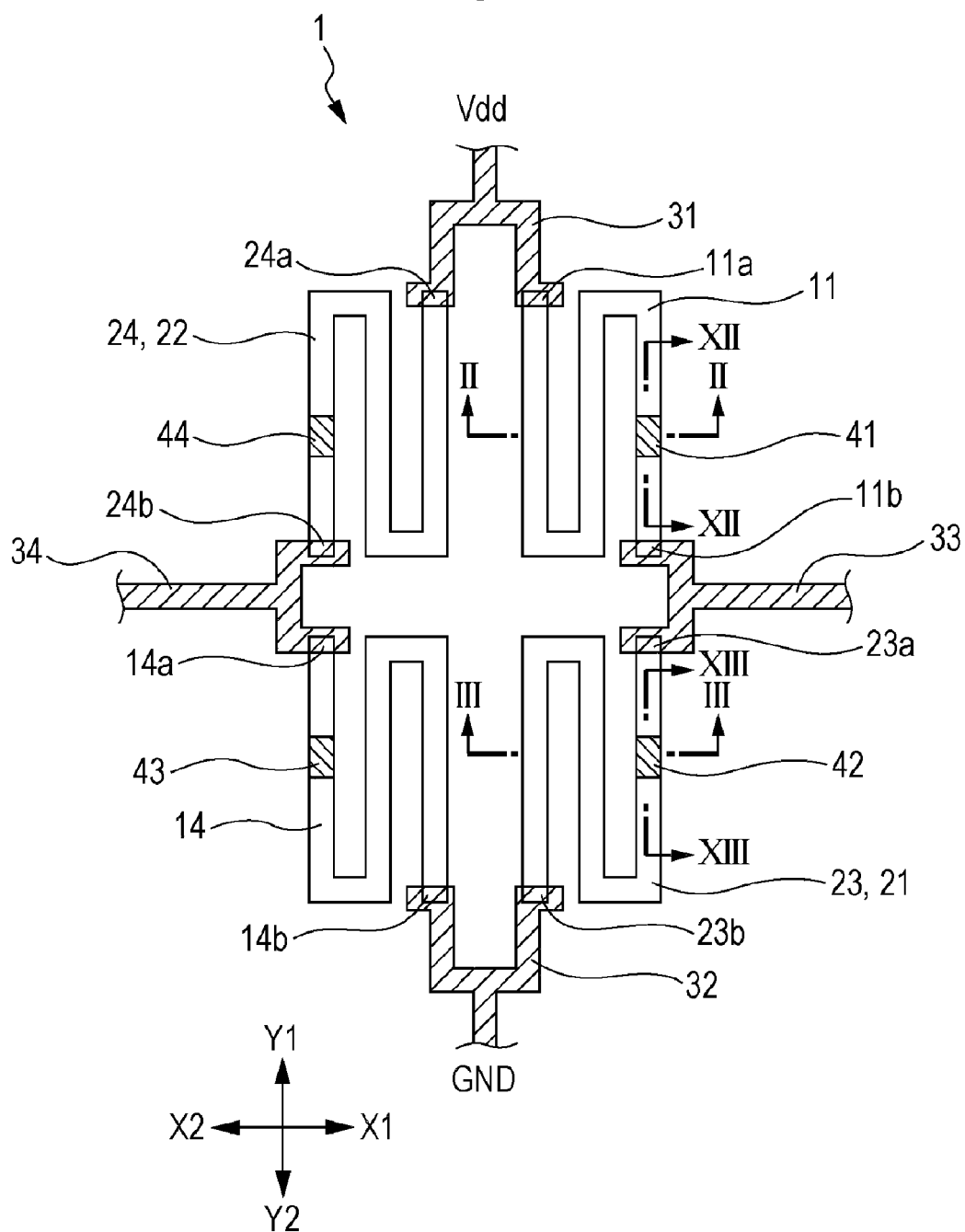
FIG. 1 is a schematic plan view of a magnetic detector according to a first embodiment.
Figure 2:
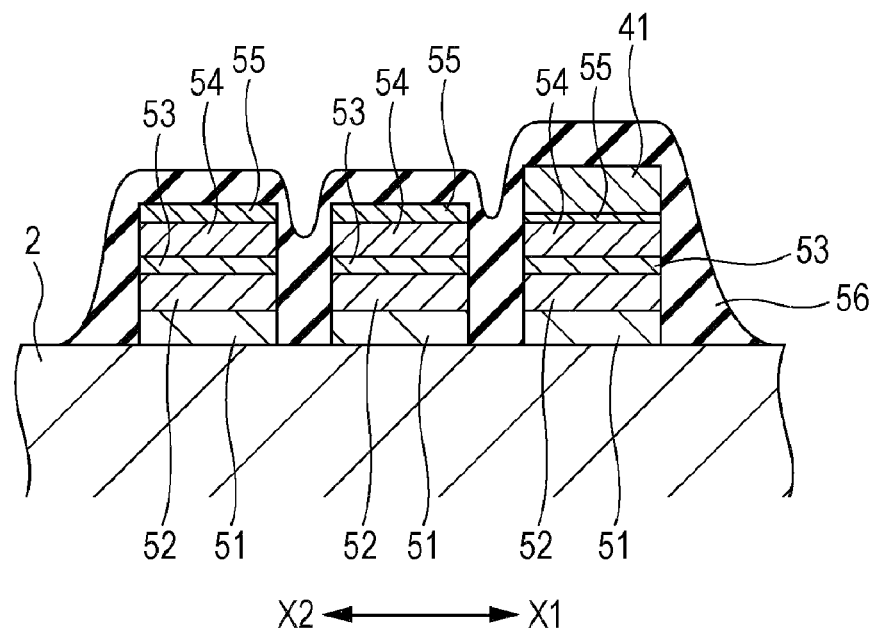
FIG. 2 is a schematic enlarged cross-sectional view taken along line II-II in FIG. 1.
Figure 3:
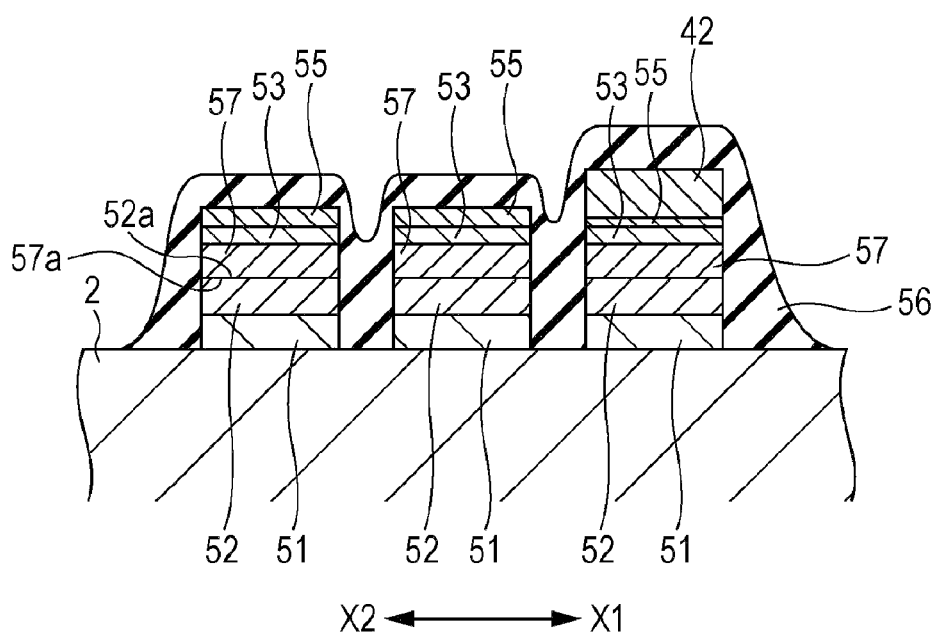
FIG. 3 is a schematic enlarged cross-sectional view taken along line III-III in FIG. 1.
Figure 6:
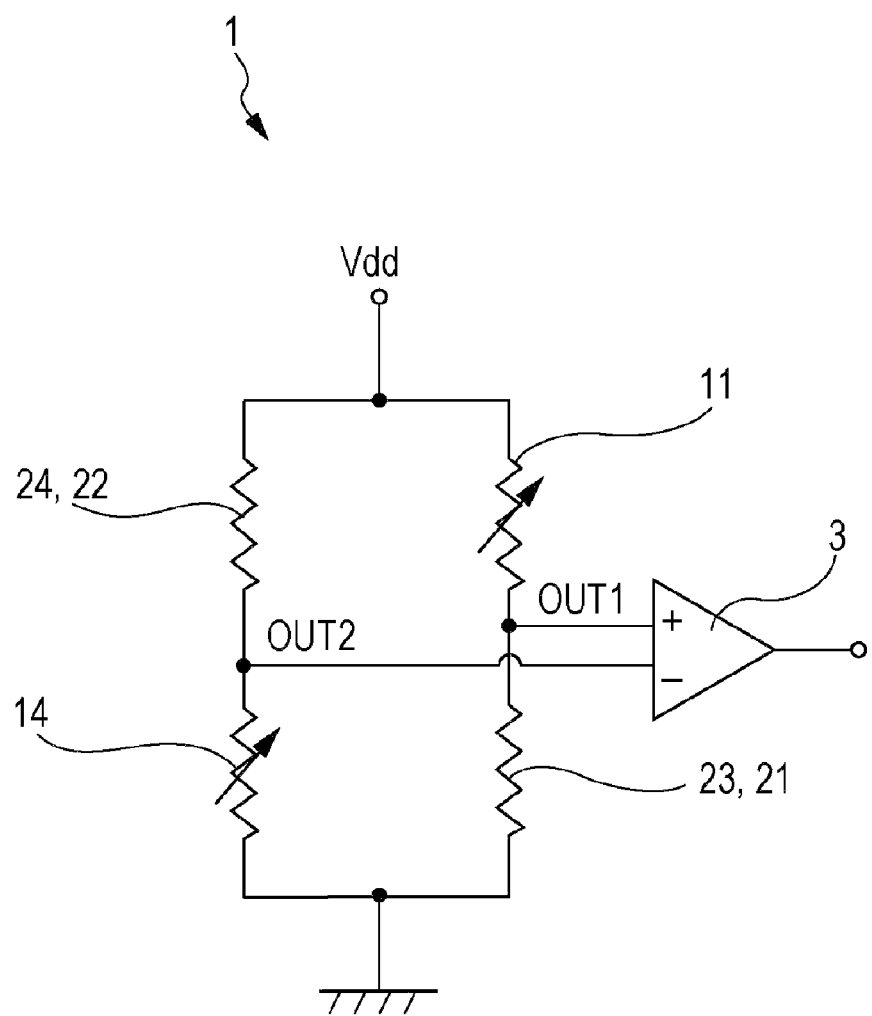
FIG. 6 is a schematic circuit diagram of the magnetic detector according to the first embodiment.

FIG. 1 is a schematic plan view of a magnetic detector 1 according to a first embodiment of the present invention. FIG. 2 is a schematic enlarged cross-sectional view taken along line II-II in FIG. 1. FIG. 3 is a schematic enlarged cross-sectional view taken along line III-III in FIG. 1. FIG. 6 is a schematic circuit diagram of the magnetic detector 1 illustrated in FIG. 1.

As illustrated in FIGS. 1 and 6, in the magnetic detector 1, a first magnetoresistance effect element layer 11 and a first resistance element layer 21 are connected in series to each other, and a second resistance element layer 22 and a fourth magnetoresistance effect element layer 14 are connected in series to each other. A voltage is applied to the first magnetoresistance effect element layer 11 and the first resistance element layer 21 connected in series to each other, and a voltage is applied to the second resistance element layer 22 and the fourth magnetoresistance effect element layer 14 connected in series to each other. A first output (OUT1) is obtained from a midpoint between the first magnetoresistance effect element layer 11 and the first resistance element layer 21, and a second output (OUT2) is obtained from a midpoint between the second resistance element layer 22 and the fourth magnetoresistance effect element layer 14.

FIG. 1 illustrates a case where a first short-circuit layer 41, a second short-circuit layer 42, a third short-circuit layer 43, and a fourth short-circuit layer 44 short-circuit the first magnetoresistance effect element layer 11, the first resistance element layer 21, the fourth magnetoresistance effect element layer 14, and the second resistance element layer 22, respectively.

The first magnetoresistance effect element layer 11 and the fourth magnetoresistance effect element layer 14 have the same structure and the same plane pattern. The plane pattern of the first magnetoresistance effect element layer 11 and the fourth magnetoresistance effect element layer 14 has a meander shape, which is a long band-like shape with plural turns forming a stripe pattern. With this pattern, the substantial length can be increased to acquire a large basic electrical resistance value. Accordingly, the value of current supplied from a power supply layer 31 is suppressed to be small, and the magnetic detector 1 is driven by low power.

As illustrated in FIG. 2, which is a schematic enlarged cross-sectional view taken along line II-II in FIG. 1, the first magnetoresistance effect element layer 11 and the fourth magnetoresistance effect element layer 14 have a multilayer structure. An antiferromagnetic layer 51, a first pinned magnetic layer 52, a nonmagnetic conductive layer 53, and a free magnetic layer 54 are stacked and deposited in this order on a substrate 2 of the magnetic detector 1. A surface of the free magnetic layer 54 is covered with a protective layer 55.

The antiferromagnetic layer 51 is formed of an antiferromagnetic material, such as an Ir—Mn alloy (iridium-manganese alloy). The first pinned magnetic layer 52 is formed of a soft magnetic material, such as a Co—Fe alloy (cobalt-iron alloy). The nonmagnetic conductive layer 53 is formed of Cu (copper) or the like. The free magnetic layer 54 is formed of a soft magnetic material, such as an Ni—Fe alloy (nickel-iron alloy). The protective layer 55 is formed of Ta (tantalum) or the like.

In the first magnetoresistance effect element layer 11 and the fourth magnetoresistance effect element layer 14, the magnetization direction of the first pinned magnetic layer 52 is pinned due to the exchange coupling between the antiferromagnetic layer 51 and the first pinned magnetic layer 52. In this embodiment, the magnetization direction of the first pinned magnetic layer 52 is pinned in X2 direction.

Figure 11:
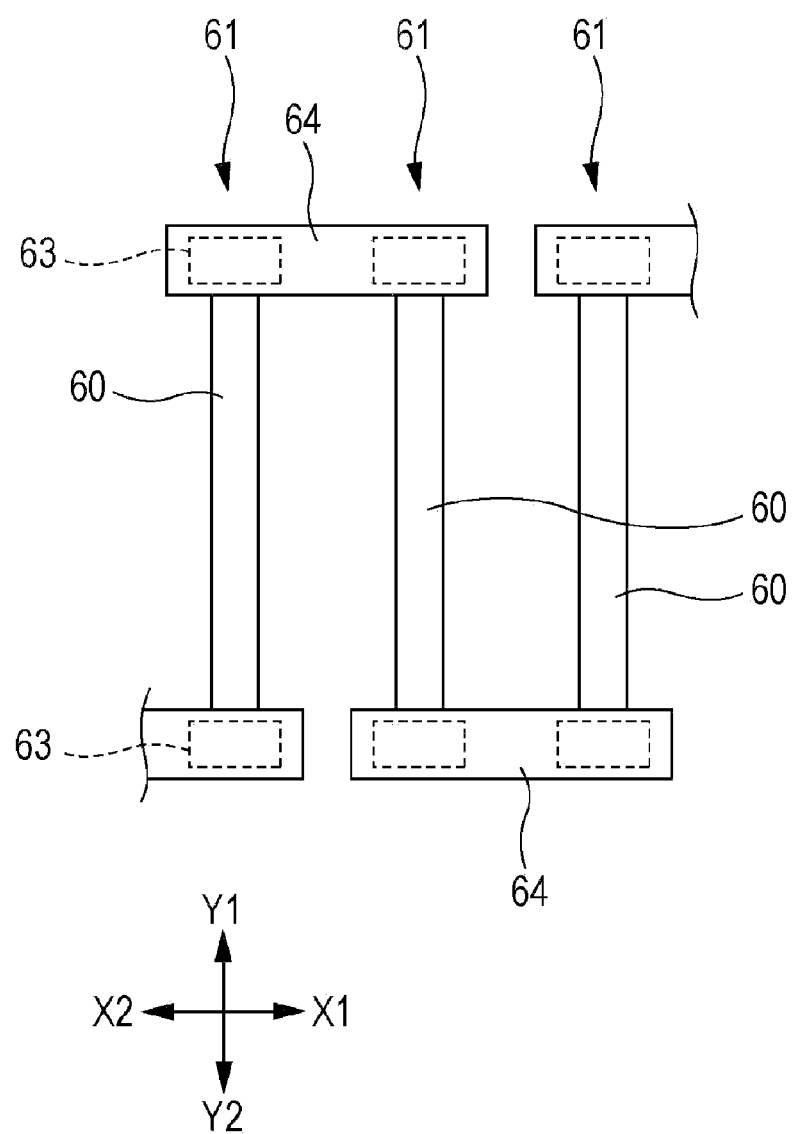
FIG. 11 is a schematic plan view of a magnetoresistance effect element layer according to the first embodiment.

In the first magnetoresistance effect element layer 11 and the fourth magnetoresistance effect element layer 14, as illustrated in FIG. 11, outer permanent magnet layers 63 are provided on both sides in the longitudinal direction (Y1-Y2 direction) of element portions 60 having the same multilayer structure as that illustrated in FIG. 2. The element portions 60 and the outer permanent magnet layers 63 constitute element assemblies 61 extending in a band-like shape.

The element assemblies 61 are disposed at intervals in the lateral direction (X1-X2 direction). Both ends of the individual element assemblies 61 are connected to connecting portions 64, and thereby forming a magnetoresistance effect element having a meander shape.

In this case, a bias magnetic field component in the longitudinal direction (Y1-Y2 direction) acts from the outer permanent magnet layers 63 to the element portions 60. Thus, the magnetization direction of the free magnetic layer 54 constituting the element portions 60 is the longitudinal direction (Y1-Y2 direction) when there is no magnetic field.

In this embodiment, the outer permanent magnet layers 63 are provided. Alternatively, a plurality of intermediate magnet layers, which are permanent magnet layers, may be provided, and the element portions 60 and the intermediate magnet layers may be alternately disposed in the longitudinal direction (Y1-Y2 direction).

Figure 4:
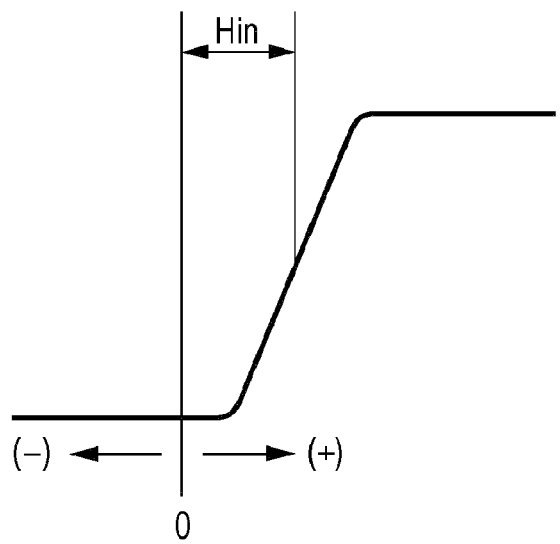
FIG. 4 is a characteristic diagram illustrating a characteristic of a magnetoresistance effect element layer in which electrical resistance increases in the positive direction in a magnetic field.

FIG. 4 is a characteristic diagram illustrating a characteristic of a magnetoresistance effect element layer having an electrical resistance which increases in the positive direction in a magnetic field. The vertical axis indicates electrical resistance, and the horizontal axis indicates the strength and direction of a magnetic field. Regarding the directions of the magnetic field, X1 direction is represented by (+) and X2 direction is represented by (−). When an external magnetic field acts in the (−) direction, that is, in X2 direction, the electrical resistance does not change. When a magnetic field is applied in the (+) direction, that is, in X1 direction, and when the strength of the magnetic field increases to be a certain value or more, the electrical resistance increases. The magnetic field strength in the center region between the maximum electrical resistance and the minimum electrical resistance is represented by Hin. The electrical resistances of the first magnetoresistance effect element layer 11 and the fourth magnetoresistance effect element layer 14 change in the same manner as that in this characteristic diagram.

In this embodiment, the first resistance element layer 21 is a first pinned resistance element layer 23, and the second resistance element layer 22 is a second pinned resistance element layer 24. The first pinned resistance element layer 23 and the second pinned resistance element layer 24 have the same structure and the same plane pattern. The plane pattern of the first pinned resistance element layer 23 and the second pinned resistance element layer 24 has a meander shape. As illustrated in FIG. 3, which is a schematic enlarged cross-sectional view taken along III-III line in FIG. 1, the first pinned resistance element layer 23 and the second pinned resistance element layer 24 have a multilayer structure, like the first magnetoresistance effect element layer 11 and the fourth magnetoresistance effect element layer 14. The materials and thicknesses of the individual layers of the first pinned resistance element layer 23 and the second pinned resistance element layer 24 are the same as those of the first magnetoresistance effect element layer 11 and the fourth magnetoresistance effect element layer 14. However, in the first pinned resistance element layer 23 and the second pinned resistance element layer 24, the stack order of the nonmagnetic conductive layer 53 and the free magnetic layer 54 is opposite with respect to the stack order in the first magnetoresistance effect element layer 11 and the fourth magnetoresistance effect element layer 14. That is, in the first pinned resistance element layer 23 and the second pinned resistance element layer 24, the antiferromagnetic layer 51, the first pinned magnetic layer 52, a second pinned magnetic layer 57 having the same composition as that of the free magnetic layer 54, the nonmagnetic conductive layer 53, and the protective layer 55 are stacked in this order from the substrate 2 side. In the first pinned magnetic layer 52 and the second pinned magnetic layer 57, a surface 52a of the first pinned magnetic layer 52 on the side opposite to the substrate 2 is in contact with a surface 57a of the second pinned magnetic layer 57 on the substrate 2 side while facing each other, and thus the first pinned magnetic layer 52 and the second pinned magnetic layer 57 are ferromagnetically coupled to each other. As a result, the first pinned magnetic layer 52 and the second pinned magnetic layer 57 function as an integrated pinned magnetic layer, and the magnetization thereof is pinned.

The first pinned resistance element layer 23, the second pinned resistance element layer 24, the first magnetoresistance effect element layer 11, and the fourth magnetoresistance effect element layer 14 are formed on the same substrate 2. Thus, the magnetization direction of the first pinned magnetic layer 52 in the first pinned resistance element layer 23 and the second pinned resistance element layer 24 is pinned in X2 direction, as in the first magnetoresistance effect element layer 11 and the fourth magnetoresistance effect element layer 14. However, in the first pinned resistance element layer 23 and the second pinned resistance element layer 24, the second pinned magnetic layer 57 is stacked on the first pinned magnetic layer 52. Thus, the magnetization direction of the second pinned magnetic layer 57 is pinned, and the electrical resistance does not change even when an external magnetic field acts thereon.

Furthermore, in the first pinned resistance element layer 23 and the second pinned resistance element layer 24, the configuration and thicknesses of the layers are the same. Thus, a change rate of electrical resistance and so forth caused by change in environmental temperature is almost the same. This is the same in the first magnetoresistance effect element layer 11 and the fourth magnetoresistance effect element layer 14.

As illustrated in FIG. 1, the power supply layer 31 is connected to an end 11a on Y1 side of the first magnetoresistance effect element layer 11 and an end 24a on Y1 side of the second pinned resistance element layer 24, the end 24a being on the left of the end 11a. A ground layer 32 is connected to an end 14b on Y2 side of the fourth magnetoresistance effect element layer 14 and an end 23b on Y2 side of the first pinned resistance element layer 23. The ground layer 32 is set to be at a ground potential, and a certain power supply voltage (Vdd) is applied between the power supply layer 31 and the ground layer 32.

A first output conductive layer 33 is connected to an end 11b on Y2 side of the first magnetoresistance effect element layer 11 and an end 23a on Y1 side of the first pinned resistance element layer 23. A second output conductive layer 34 is connected to an end 14a on Y1 side of the fourth magnetoresistance effect element layer 14 and an end 24b on Y2 side of the second pinned resistance element layer 24.

As illustrated in FIG. 1, the first short-circuit layer 41 and the third short-circuit layer 43 are disposed at a certain distance from both ends in the longitudinal direction (Y1-Y2 direction) of the first magnetoresistance effect element layer 11 and the fourth magnetoresistance effect element layer 14, respectively. Also, the second short-circuit layer 42 and the fourth short-circuit layer 44 are disposed at a certain distance from both ends in the longitudinal direction (Y1-Y2 direction) of the first pinned resistance element layer 23 and the second pinned resistance element layer 24, respectively. As illustrated in FIG. 2, the first short-circuit layer 41 and the third short-circuit layer 43 cover parts of the magnetoresistance effect element layers 11 and 14 while being in contact with the protective layer 55 that is partially removed. As illustrated in FIG. 3, the second short-circuit layer 42 and the fourth short-circuit layer 44 cover parts of the pinned resistance element layers 23 and 24 while being in contact with the protective layer 55 that is partially removed.

In this way, each of the first short-circuit layer 41 and the third short-circuit layer 43 is electrically connected to and disposed on only the first magnetoresistance effect element layer 11 or the fourth magnetoresistance effect element layer 14. Each of the second short-circuit layer 42 and the fourth short-circuit layer 44 is electrically connected to and disposed on only the first pinned resistance element layer 23 or the second pinned resistance element layer 24.

A method for forming the first short-circuit layer 41, the second short-circuit layer 42, the third short-circuit layer 43, and the fourth short-circuit layer 44 will be described. A resist is applied onto the first magnetoresistance effect element layer 11, the fourth magnetoresistance effect element layer 14, the first pinned resistance element layer 23, and the second pinned resistance element layer 24. Subsequently, exposure is performed using a reticle having opening patterns of the first short-circuit layer 41, the second short-circuit layer 42, the third short-circuit layer 43, and the fourth short-circuit layer 44, and then development is performed so as to form a resist pattern. Subsequently, part of the protective layer 55 in the opening patterns is removed by using ion milling, dry etching, or the like. Subsequently, conductive films serving as the first short-circuit layer 41, the second short-circuit layer 42, the third short-circuit layer 43, and the fourth short-circuit layer 44 are formed by using sputtering or the like. Subsequently, the resist is removed. Accordingly, the first short-circuit layer 41, the second short-circuit layer 42, the third short-circuit layer 43, and the fourth short-circuit layer 44 are formed at certain positions. After that, a passivation layer 56 is formed to cover the surface.

Preferably, the widths (in X2-X1 direction) of the individual opening patterns are equal to or close to the widths (in X2-X1 direction) of the first magnetoresistance effect element layer 11, the first pinned resistance element layer 23, the second pinned resistance element layer 24, and the fourth magnetoresistance effect element layer 14 on which the first short-circuit layer 41, the second short-circuit layer 42, the fourth short-circuit layer 44, and the third short-circuit layer 43 are formed, respectively.

Figure 8A:
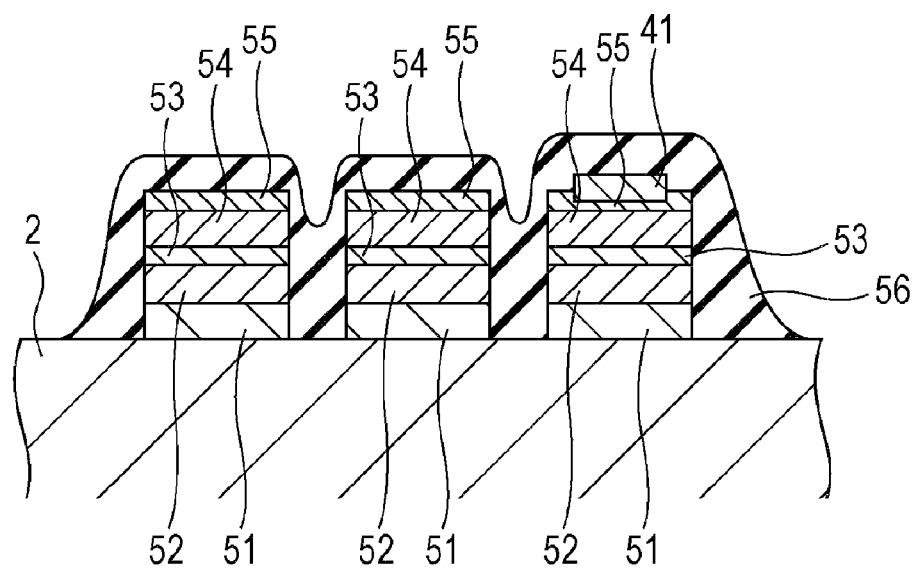
FIGS. 8A and 8B are schematic cross-sectional views of examples of a magnetoresistance effect element layer and a pinned resistance element layer according to the first embodiment.
Figure 8B:
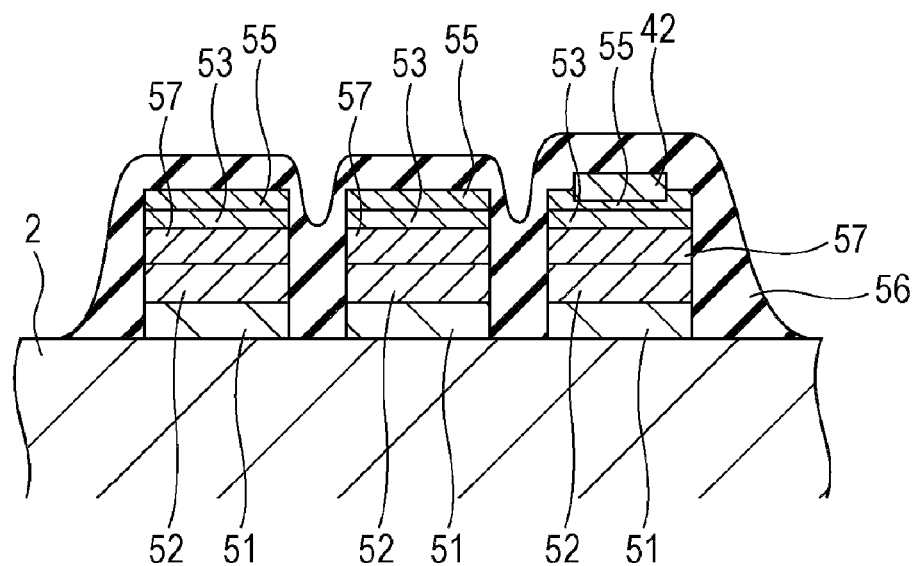

The widths of the opening patterns may be smaller than the widths (in X2-X1 direction) of the first magnetoresistance effect element layer 11, the first pinned resistance element layer 23, the second pinned resistance element layer 24, and the fourth magnetoresistance effect element layer 14. In this case, as illustrated in FIGS. 8A and 8B, part of the side surfaces of each of the first short-circuit layer 41, the second short-circuit layer 42, the third short-circuit layer 43, and the fourth short-circuit layer 44 is covered with the protective layer 55.

Figure 9A:
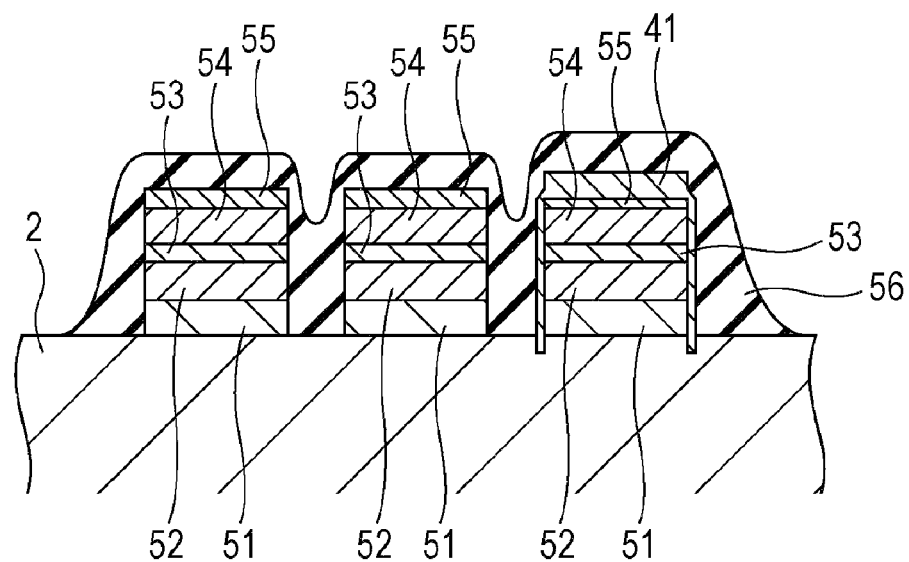
FIGS. 9A and 9B are schematic cross-sectional views of examples of the magnetoresistance effect element layer and the pinned resistance element layer according to the first embodiment.
Figure 9B:
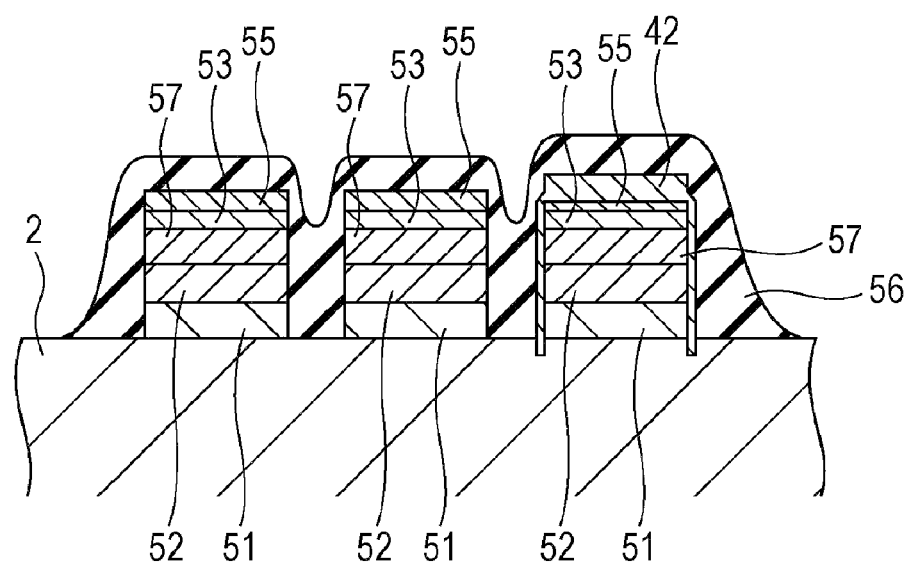

Also, the widths of the opening patterns may be larger than the widths (in X2-X1 direction) of the first magnetoresistance effect element layer 11, the first pinned resistance element layer 23, the second pinned resistance element layer 24, and the fourth magnetoresistance effect element layer 14. In this case, as illustrated in FIGS. 9A and 9B, each of the first short-circuit layer 41, the second short-circuit layer 42, the third short-circuit layer 43, and the fourth short-circuit layer 44 may cover the side surfaces of the antiferromagnetic layer 51, the first pinned magnetic layer 52, the nonmagnetic conductive layer 53, the free magnetic layer 54, and the protective layer 55, or the side surfaces of the antiferromagnetic layer 51, the first pinned magnetic layer 52, the second pinned magnetic layer 57, the nonmagnetic conductive layer 53, and the protective layer 55.

In this case, the widths (in X2-X1 direction) of the first short-circuit layer 41, the second short-circuit layer 42, the third short-circuit layer 43, and the fourth short-circuit layer 44 may be set to, for example, about 0.5 to 2 times the widths (in X2-X1 direction) of the first magnetoresistance effect element layer 11, the first pinned resistance element layer 23, the fourth magnetoresistance effect element layer 14, and the second pinned resistance element layer 24 to which the respective short-circuit layers are electrically connected and on which the respective short-circuit layers are disposed. Furthermore, the widths may be larger than about 0.5 to 2 times if inconvenience, such as short circuit between wiring lines, does not occur.

In this way, the first short-circuit layer 41 is disposed in an inner region (first certain range) defined by a boundary that is externally extended to about 0.5 times the width (in X2-X1 direction) of the first magnetoresistance effect element layer 11 or the first pinned resistance element layer 23 at the maximum, from the outer edge of the plane pattern of the first magnetoresistance effect element layer 11 or the first pinned resistance element layer 23. Also, the second short-circuit layer 42 is disposed in an inner region (second certain range) defined by a boundary that is externally extended to about 0.5 times the width (in X2-X1 direction) of the first magnetoresistance effect element layer 11 or the first pinned resistance element layer 23 at the maximum, from the outer edge of the plane pattern of the first magnetoresistance effect element layer 11 or the first pinned resistance element layer 23. This is the same in the third short-circuit layer 43 and the fourth short-circuit layer 44.

In this case, the first certain range and the second certain range are determined on the basis of the larger widths of the first magnetoresistance effect element layer 11 and the first pinned resistance element layer 23. This is the same in the third short-circuit layer 43 and the fourth short-circuit layer 44.

In this case, the intervals at which the element layers 11, 23, 24, and 14 are disposed in the lateral direction (X2-X1 direction) are set on the basis of the maximum widths (in X2-X1 direction) of the short-circuit layers 41, 42, 43, and 44, so that each of the element layers 11, 23, 24, and 14 having a meander shape does not short-circuit.

In this way, the first short-circuit layer 41, the second short-circuit layer 42, the third short-circuit layer 43, and the fourth short-circuit layer 44 are electrically connected to only the first magnetoresistance effect element layer 11, the first pinned resistance element layer 23, the fourth magnetoresistance effect element layer 14, and the second pinned resistance element layer 24, respectively, and are disposed in certain ranges of the respective layers. Accordingly, the plurality of protruding current bypasses disclosed in Japanese Unexamined Patent Application Publication No. 2008-46076 are not necessary, and thus this embodiment has an advantage of a reduction in size.

The power supply layer 31, the ground layer 32, the first output conductive layer 33, the second output conductive layer 34, the first short-circuit layer 41, the second short-circuit layer 42, the third short-circuit layer 43, and the fourth short-circuit layer 44 have an electrical resistance smaller than that of the first magnetoresistance effect element layer 11, the fourth magnetoresistance effect element layer 14, the first pinned resistance element layer 23, and the second pinned resistance element layer 24, and are formed of a metal among aluminum, copper, silver, gold, etc., or an alloy of such metals, or a conductive ink containing silver powder or gold powder.

As illustrated in FIGS. 2 and 3, the first magnetoresistance effect element layer 11, the fourth magnetoresistance effect element layer 14, the first pinned resistance element layer 23, and the second pinned resistance element layer 24 are covered with the passivation layer 56. The passivation layer 56 is nonmagnetic and nonconductive, and may be formed of, for example, an inorganic-material layer such as a silicon oxide layer ($SiO_2$) or aluminum layer ($Al_2O_3$), or an organic-material layer.

Preferable values of electrical resistances to be set to the first magnetoresistance effect element layer 11, the fourth magnetoresistance effect element layer 14, the first pinned resistance element layer 23, and the second pinned resistance element layer 24 included in the magnetic detector 1 can be calculated by measuring the electrical resistances of the first magnetoresistance effect element layer 11, the fourth magnetoresistance effect element layer 14, the first pinned resistance element layer 23, and the second pinned resistance element layer 24, in part of a plurality of magnetic detectors 1 formed on the same substrate 2. For example, the electrical resistances of the first magnetoresistance effect element layer 11, the fourth magnetoresistance effect element layer 14, the first pinned resistance element layer 23, and the second pinned resistance element layer 24 are measured when no magnetic field is being applied thereto, exposure is performed by a stepper by using a reticle having a pattern of a combination of the first short-circuit layer 41, the second short-circuit layer 42, the third short-circuit layer 43, and the fourth short-circuit layer 44 of certain lengths (Y1-Y2 direction), and then a process is performed. Accordingly, the potentials of the first output conductive layer 33 and the second output conductive layer 34 can be set to half the power supply voltage (potential at the midpoint). At this time, adjustment is performed so that the electrical resistance of the first magnetoresistance effect element layer 11 becomes the same as the electrical resistance of the first pinned resistance element layer 23, and so that the electrical resistance of the fourth magnetoresistance effect element layer 14 becomes the same as the electrical resistance of the second pinned resistance element layer 24.

In this case, the reticle has a plurality of combinations of patterns of the first short-circuit layer 41, the second short-circuit layer 42, the third short-circuit layers 43, and the fourth short-circuit layer 44, in which the second short-circuit layer 42 is longer than the first short-circuit layer 41 in Y1-Y2 direction and the fourth short-circuit layer 44 is longer than the third short-circuit layer 43 in Y1-Y2 direction. The first short-circuit layer 41 is electrically connected to and disposed on one of the first magnetoresistance effect element layer 11 and the first pinned resistance element layer 23 having a lower electrical resistance, and thereby short-circuiting the first magnetoresistance effect element layer 11 or the first pinned resistance element layer 23 using the first short-circuit layer 41. The second short-circuit layer 42 is electrically connected to and disposed on the other of the first magnetoresistance effect element layer 11 and the first pinned resistance element layer 23 having a higher electrical resistance, and thereby short-circuiting the first magnetoresistance effect element layer 11 or the first pinned resistance element layer 23 using the second short-circuit layer 42. The third short-circuit layer 43 is electrically connected to and disposed on one of the fourth magnetoresistance effect element layer 14 and the second pinned resistance element layer 24 having a lower electrical resistance, and thereby short-circuiting the fourth magnetoresistance effect element layer 14 or the second pinned resistance element layer 24 using the third short-circuit layer 43. The fourth short-circuit layer 44 is electrically connected to and disposed on the other of the fourth magnetoresistance effect element layer 14 and the second pinned resistance element layer 24 having a higher electrical resistance, and thereby short-circuiting the fourth magnetoresistance effect element layer 14 or the second pinned resistance element layer 24 using the fourth short-circuit layer 44.

In this case, since the second short-circuit layer 42 is longer than the fist short-circuit layer 41 in Y1-Y2 direction, the electrical resistance of the other of the first magnetoresistance effect element layer 11 and the first pinned resistance element layer 23 having a higher electrical resistance and short-circuited by the second short-circuit layer 42 decreases more significantly than the electrical resistance of the one of the first magnetoresistance effect element layer 11 and the first pinned resistance element layer 23 having a lower electrical resistance and short-circuited by the first short-circuit layer 41. Thus, the electrical resistances of the first magnetoresistance effect element layer 11 and the first pinned resistance element layer 23 can be adjusted to be the same. This is the same in the fourth magnetoresistance effect element layer 14 and the second pinned resistance element layer 24.

For example, the length, width, and electrical resistance value of each of the first magnetoresistance effect element layer 11, the first pinned resistance element layer 23, the second pinned resistance element layer 24, and the fourth magnetoresistance effect element layer 14 are about 420 µm, about 3 µm, and about 1700Ω, respectively. The width of each of the first short-circuit layer 41, the second short-circuit layer 42, the third short-circuit layer 43, and the fourth short-circuit layer 44 is about 5 µm. Regarding the length thereof, a plurality of patterns are prepared in which the length increases at the pitch of about 0.2 µm, with a minimum length of about 5 µm.

In this case, referring to FIG. 6, for example, the difference between the first output (OUT1) and the second output (OUT2) in a state where no external magnetic field is applied is about 0.16% of the power supply voltage (Vdd) before adjustment of electrical resistance. However, after adjustment of electrical resistance, the difference is improved to about 0.001% of the power supply voltage (Vdd).

Figure 12:
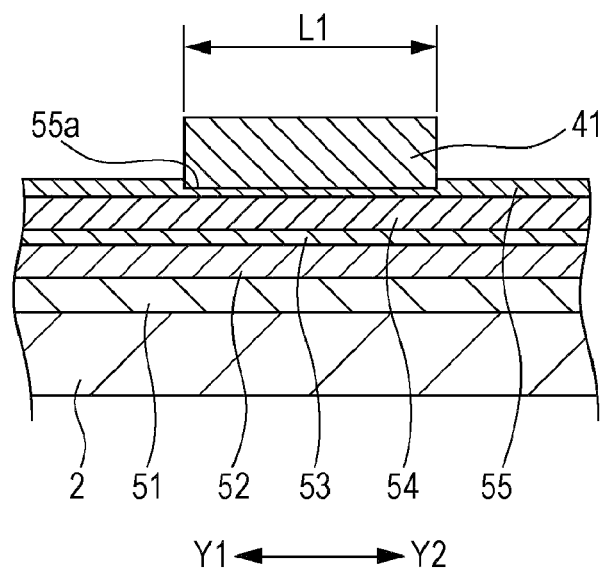
FIG. 12 is a schematic enlarged cross-sectional view taken along line XII-XII in FIG. 1.

FIG. 12 illustrates an enlarged cross-sectional view taken along line XII-XII in FIG. 1. The first short-circuit layer 41, which is low-resistive and conductive, is in contact with a surface 55a of the partially removed protective layer 55. Accordingly, the first magnetoresistance effect element layer 11 is short-circuited by the first short-circuit layer 41 in the longitudinal direction (Y1-Y2 direction). In this case, the electrical resistivity of the first short-circuit layer 41 is sufficiently low with respect to the electrical resistivity of the first magnetoresistance effect element layer 11. Thus, the electrical resistance of the first magnetoresistance effect element layer 11 is decreased by the electrical resistance value corresponding to L1 (first short-circuit length) illustrated in FIG.

12, which is the maximum length of the short circuit in the longitudinal direction (Y1-Y2 direction). That is, the length L1 is a first short-circuit length.

Figure 13:
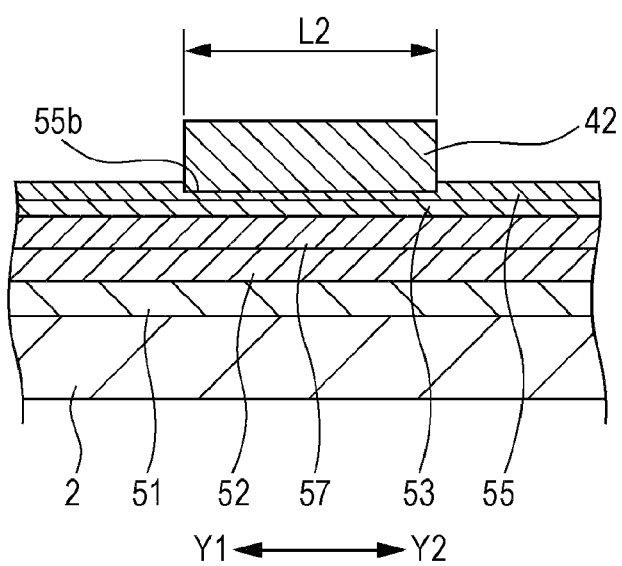
FIG. 13 is a schematic enlarged cross-sectional view taken along line XIII-XIII in FIG. 1.

FIG. 13 illustrates an enlarged cross-sectional view taken along line XIII-XIII in FIG. 1. The second short-circuit layer 42, which is low-resistive and conductive, is in contact with a surface 55b of the partially removed protective layer 55. Accordingly, the first pinned resistance element layer 23 is short-circuited by the second short-circuit layer 42 in the longitudinal direction (Y1-Y2 direction). In this case, the electrical resistivity of the second short-circuit layer 42 is sufficiently low with respect to the electrical resistivity of the first pinned resistance element layer 23. Thus, the electrical resistance of the first pinned resistance element layer 23 is decreased by the electrical resistance value corresponding to L2 (second short-circuit length) illustrated in FIG. 13, which is the maximum length of the short circuit in the longitudinal direction (Y1-Y2 direction). That is, the length L2 is a second short-circuit length.

This is the same in the third short-circuit layer 43 and the fourth short-circuit layer 44.

Figure 14:
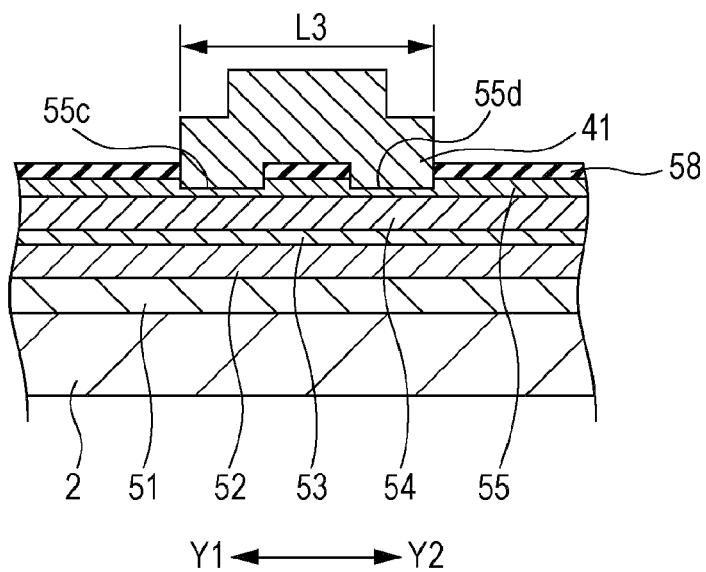
FIG. 14 is a schematic enlarged cross-sectional view of a first short-circuit layer according to a modification.

FIG. 14 illustrates a modification of the first short-circuit layer 41. FIG. 14 is a schematic enlarged cross-sectional view taken along line XII-XII in FIG. 1. In this modification, an insulating film 58 is formed on the protective layer 55, and the insulating film 58 and the protective layer 55 are partially removed with spacing. The first short-circuit layer 41, which is low-resistive and conductive, is in contact with a surface 55c and a surface 55d of the two removed portions. Accordingly, the first magnetoresistance effect element layer 11 is short-circuited by the first short-circuit layer 41 in the longitudinal direction (Y1-Y2 direction). In this case, the electrical resistivity of the first short-circuit layer 41 is sufficiently low with respect to the electrical resistivity of the first magnetoresistance effect element layer 11. Thus, the electrical resistance of the first magnetoresistance effect element layer 11 is decreased by the electrical resistance value corresponding to L3 (first short-circuit length) illustrated in FIG. 14, which is the maximum length of the short circuit in the longitudinal direction (Y1-Y2 direction). That is, the length L3 is a first short-circuit length.

Figure 15:
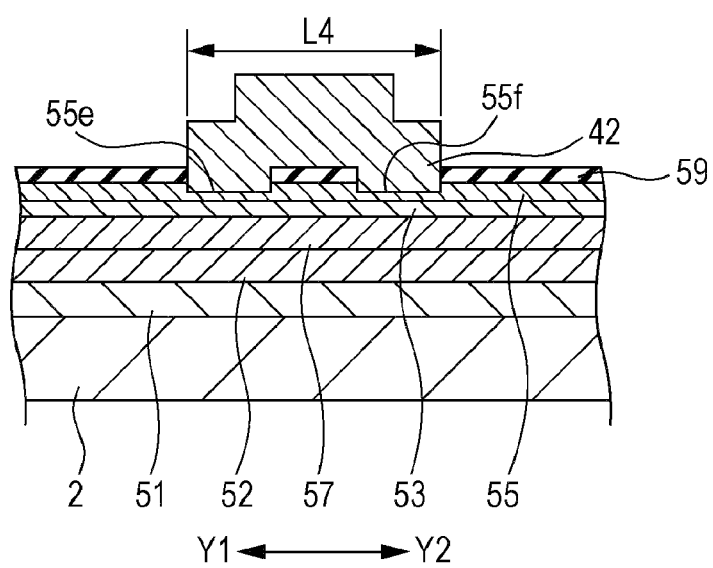
FIG. 15 is a schematic enlarged cross-sectional view of a second short-circuit layer according to a modification.

FIG. 15 illustrates a modification of the second short-circuit layer 42. FIG. 15 is a schematic enlarged cross-sectional view taken along line XIII-XIII in FIG. 1. In this modification, an insulating film 59 is formed on the protective layer 55, and the insulating film 59 and the protective layer 55 are partially removed with spacing. The second short-circuit layer 42, which is low-resistive and conductive, is in contact with a surface 55e and a surface 55f of the two removed portions. Accordingly, the first pinned resistance element layer 23 is short-circuited by the second short-circuit layer 42 in the longitudinal direction (Y1-Y2 direction). In this case, the electrical resistivity of the second short-circuit layer 42 is sufficiently low with respect to the electrical resistivity of the first pinned resistance element layer 23. Thus, the electrical resistance of the first pinned resistance element layer 23 is decreased by the electrical resistance value corresponding to L4 (second short-circuit length) illustrated in FIG. 15, which is the maximum length of the short circuit in the longitudinal direction (Y1-Y2 direction). That is, the length L4 is a second short-circuit length.

This is the same in the third short-circuit layer 43 and the fourth short-circuit layer 44.

As described above, the first short-circuit length, the second short-circuit length, and the short-circuit lengths for the third short-circuit layer 43 and the fourth short-circuit layer 44 are the maximum lengths over which the respective element layers 11, 23, 24, and 14 are short-circuited by the respective short-circuit layers 41, 42, 43, and 44 in the longitudinal direction (Y1-Y2 direction).

In this embodiment, the potentials of the first output conductive layer 33 and the second output conductive layer 34 are adjusted so as to be half the power supply voltage (potential at the midpoint), but the present invention is not limited thereto. The potentials of the first output conductive layer 33 and the second output conductive layer 34 may be adjusted so as to have a certain ratio or certain difference.

The electrical resistances of the first magnetoresistance effect element layer 11 and the first pinned resistance element layer 23 are adjusted on the basis of the difference between the first short-circuit length and the second short-circuit length defined by the first short-circuit layer 41 and the second short-circuit layer 42, respectively. Also, the electrical resistances of the fourth magnetoresistance effect element layer 14 and the second pinned resistance element layer 24 are adjusted on the basis of the difference between the third short-circuit length and the fourth short-circuit length defined by the third short-circuit layer 43 and the fourth short-circuit layer 44, respectively. As illustrated in FIG. 1, the first short-circuit layer 41, the second short-circuit layer 42, the third short-circuit layer 43, and the fourth short-circuit layer 44 are positioned close to one another and thus are simultaneously exposed under the same condition. Thus, the resist dimensions on the surface of the substrate 2 of the first short-circuit layer 41, the second short-circuit layer 42, the third short-circuit layer 43, and the fourth short-circuit layer 44 after development (corresponding to the respective short-circuit lengths) shift in the same way from reticle dimensions (pattern dimensions on the surface of the substrate 2 obtained by calculating the pattern dimensions on the surface of the reticle using a reduction ratio).

The stepper performs exposure at a plurality of positions of the substrate 2 by moving the substrate 2 using a step-and-repeat method. Every time exposure is performed, the individual patterns that are exposed shift in the same way from the reticle dimensions. Thus, variations in difference in resist dimensions among certain different patterns in a plurality of exposure operations are smaller than variations in individual resist dimensions.

Figure 10A:
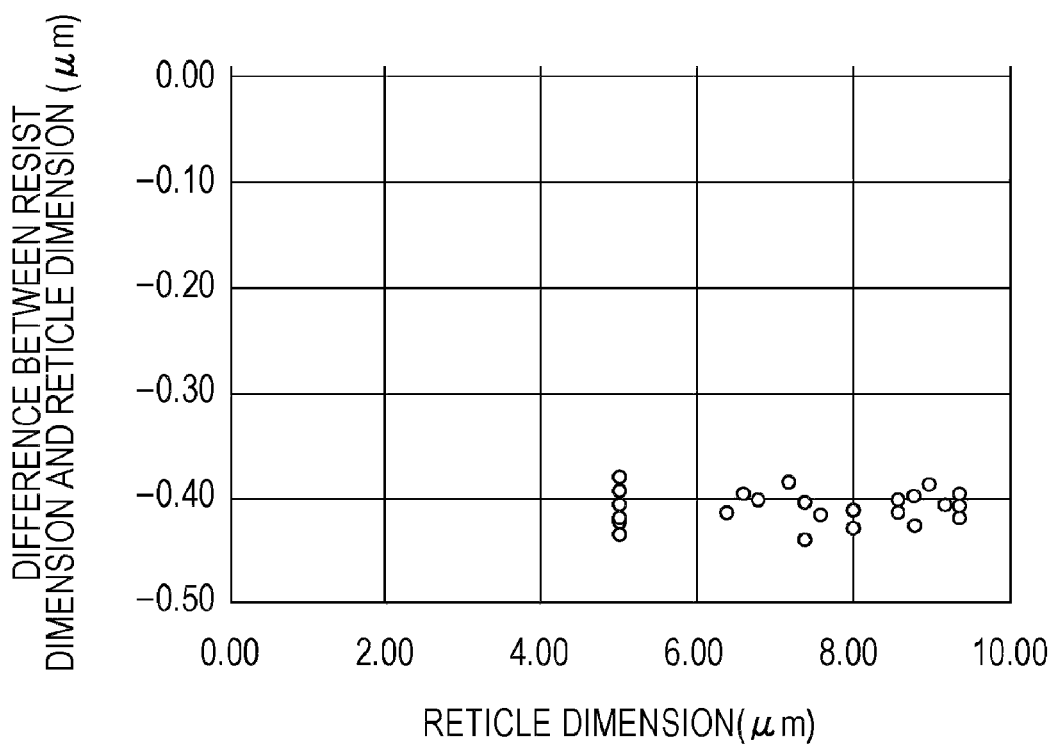
FIGS. 10A and 10B illustrate a difference between a resist dimension and a designed dimension in a stepper.
Figure 10B:
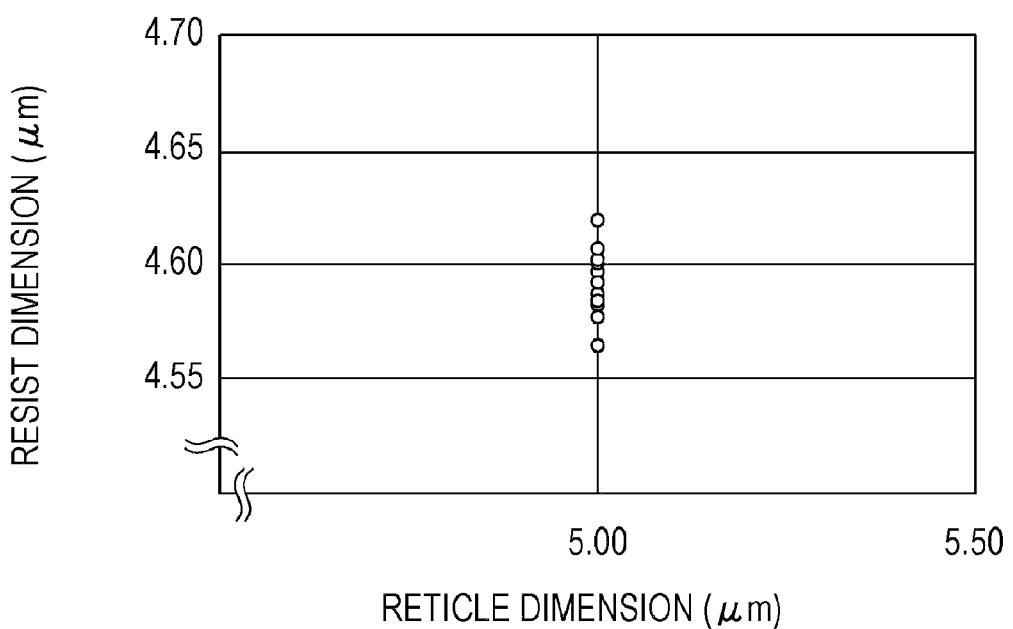

Actually, exposure was simultaneously performed by the stepper using a plurality of reticle dimensions, and resist dimensions were measured. The result is illustrated in FIG. 10A. As can be seen in FIG. 10A, the resist dimensions shift in the same way from the reticle dimensions, and almost uniformly shift by 0.4 µm. FIG. 10B illustrates a distribution of resist dimensions with respect to a reticle dimension of 5 µm. The difference between the maximum value and the minimum value is about 0.05 µm. As can be seen in FIG. 10A, the difference between the maximum value and the minimum value is about 0.05 µm also in the other reticle dimensions.

The foregoing result means the following. In a plurality of exposure operations performed by the stepper, a resist dimension varies by increasing or decreasing by about 0.4 µm from the reticle dimension. At that time, a difference in resist dimension varies at about 0.05 µm or less.

An influence of variations in the processes of exposure and development is small. Thus, a variation of a difference in dimension between the first short-circuit layer 41 (first short-circuit length) and the second short-circuit layer 42 (second short-circuit length) and a variation of a difference in dimension between the third short-circuit layer 43 (third short-circuit length) and the fourth short-circuit layer 44 (fourth short-circuit length) are smaller than variations of dimensions of the first short-circuit layer 41 (first short-circuit length), the second short-circuit layer 42 (second short-circuit length), the third short-circuit layer 43 (third short-circuit length), and the fourth short-circuit layer 44 (fourth short-circuit length), and are suppressed to a small value. In this embodiment, electrical resistance is adjusted on the basis of a difference in dimension. Accordingly, since variations of a difference in dimension in a plurality of exposure operations performed by the stepper are sufficiently small, electrical resistance can be adjusted with high accuracy.

Figure 22:
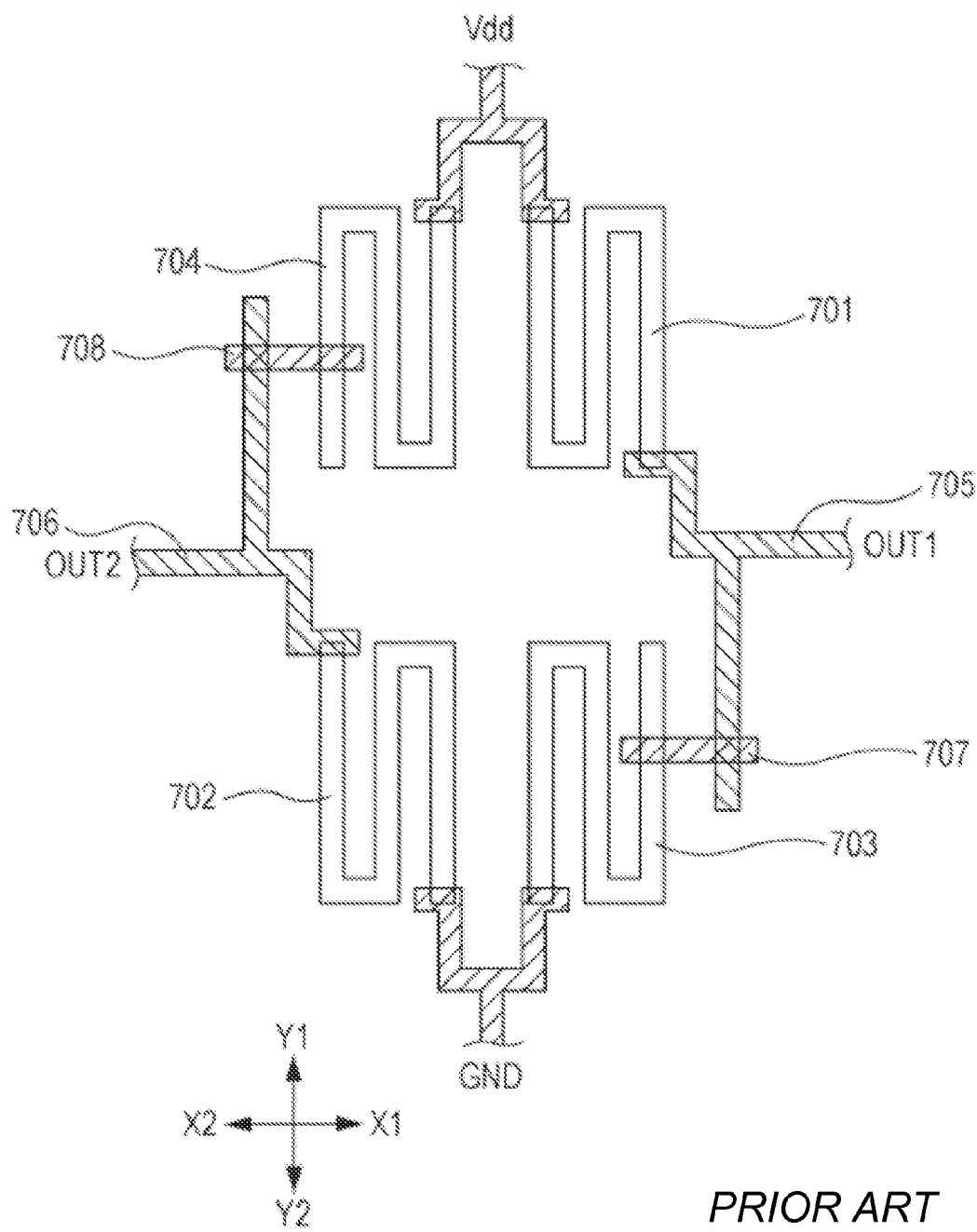
FIG. 22 is a schematic plan view of a magnetic detector disclosed in Japanese Unexamined Patent Application Publication No. 2008-58183.

However, as illustrated in FIG. 22, in the method disclosed in Japanese Unexamined Patent Application Publication No. 2008-58183, that is, in the method for adjusting an electrical resistance value by electrically connecting the magnetoresistance effect element layers 701 and 702 and at least one of the resistance element layers 703 and 704 via the conductive connection layers 707 and 708, and changing the positions of the connection layers 707 and 708, variations occur in the widths (dimension in Y1-Y2 direction) of the connection layers 707 and 708 due to a plurality of exposure operations performed by a stepper. Also, variations occur in an adjusted length of at least one of the magnetoresistance effect element layers 701 and 702 and the resistance element layers 703 and 704 connected to the connection layers 707 and 708, and the electrical resistance thereof also varies. Accordingly, highly accurate adjustment of the electrical resistance cannot be performed.

Even if the first short-circuit layer 41 and the second short-circuit layer 42 are misaligned due to misalignment of the stepper, a short-circuit length does not change if the first short-circuit layer 41 and the second short-circuit layer 42 are disposed at a certain distance from both ends of the first magnetoresistance effect element layer 11 and the first pinned resistance element layer 23, respectively. Thus, according to this embodiment, misalignment does not have an influence on adjustment of electrical resistance. Accordingly, even if variations occur in alignment in a plurality of exposure operations performed by the stepper, the variations do not have an influence on adjustment of electrical resistance, and thus electrical resistance can be adjusted highly accurately. This is the same in the third short-circuit layer 43 and the fourth short-circuit layer 44.

However, in the method disclosed in Japanese Unexamined Patent Application Publication No. 2008-58183, variations occur in alignment of the connection layers 707 and 708 in a plurality of exposure operations performed by the stepper, variations occur in an adjusted length of at least one of the magnetoresistance effect element layers 701 and 702 and the resistance element layers 703 and 704 connected to the connection layers 707 and 708, and the electrical resistance thereof also varies. Accordingly, highly accurate adjustment of the electrical resistance cannot be performed.

As illustrated in FIG. 1, there are the patterns of the power supply layer 31, the ground layer 32, the first output conductive layer 33, and the second output conductive layer 34 near the first short-circuit layer 41, the second short-circuit layer 42, the third short-circuit layer 43, and the fourth short-circuit layer 44. It is known that a nearby pattern causes halation of light during exposure, which causes variations of dimensions of a resist pattern. In order to prevent such halation, it is preferable that the first short-circuit layer 41, the second short-circuit layer 42, the third short-circuit layer 43, and the fourth short-circuit layer 44 be disposed at a certain distance from both ends in the longitudinal direction (Y1-Y2 direction) of the first magnetoresistance effect element layer 11, the first pinned resistance element layer 23, the second pinned resistance element layer 24, and the fourth magnetoresistance effect element layer 14, respectively, so as to be away from nearby patterns, such as the power supply layer 31.

Preferably, the second short-circuit length, which is the maximum length over which short-circuit is performed by the second short-circuit layer 42 in the longitudinal direction (Y1-Y2 direction), is equal to the sum of the first short-circuit length, which is the maximum length over which short-circuit is performed by the first short-circuit layer 41 in the longitudinal direction (Y1-Y2 direction), and a fifth short-circuit length, which is the length in the longitudinal direction (Y1-Y2 direction) of a first adjustment short-circuit layer, and the first short-circuit layer 41 connects to the first adjustment short-circuit layer. In the case of adjusting a difference in electrical resistance using only the first adjustment short-circuit layer, the difference in electrical resistance between the first magnetoresistance effect element layer 11 and the first pinned resistance element layer 23 is very small, and the resolution of the stepper degrades when the resist dimension of the first adjustment short-circuit layer (fifth short-circuit length) becomes close to the limit of the resolution. As a result, the accuracy of adjustment of electrical resistance also degrades. Thus, the length (in Y1-Y2 direction) of the first short-circuit layer 41 is set to be longer than the resolution of the stepper. Also, the pattern of the second short-circuit layer 42 is caused to be the same as the pattern formed by combining the first short-circuit layer 41 and the first adjustment short-circuit layer. As a result, a sufficient resolution can be obtained in the first short-circuit layer 41 (first short-circuit length) and the second short-circuit layer 42 (second short-circuit length). Also, fine adjustment of electrical resistance can be performed by adjusting electrical resistance by using the length of the first adjustment short-circuit layer (fifth short-circuit length), which is the difference in dimension between the first and second short-circuit lengths.

Figure 5:
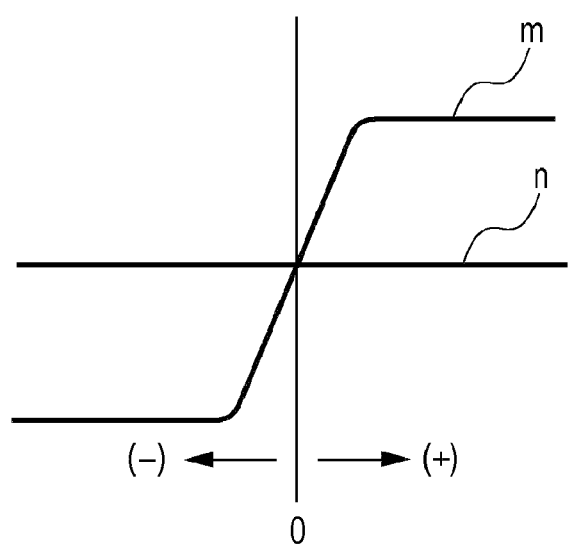
FIG. 5 is a characteristic diagram illustrating characteristics of a first magnetoresistance effect element layer and a fourth magnetoresistance effect element layer and characteristics of a first pinned resistance element layer and a second pinned resistance element layer.

FIG. 5 is a characteristic diagram illustrating characteristics (m) of the first magnetoresistance effect element layer 11 and the fourth magnetoresistance effect element layer 14 and characteristics (n) of the first pinned resistance element layer 23 and the second pinned resistance element layer 24. As illustrated in FIG. 11, the magnetization in the free magnetic layer 54 is directed in the longitudinal direction (Y1-Y2 direction), and is orthogonal to a pinned magnetic field directed in the lateral direction (X1-X2 direction) of the first pinned magnetic layer 52, due to a bias magnetic field component of the outer permanent magnet layers 63 when no external magnetic field is applied. In this way, Hin of the first magnetoresistance effect element layer 11 and the fourth magnetoresistance effect element layer 14 is adjusted to be 0 Oe, so that the electrical resistances of the first magnetoresistance effect element layer 11, the fourth magnetoresistance effect element layer 14, the first pinned resistance element layer 23, and the second pinned resistance element layer 24 are the same when no external magnetic field is applied.

In the magnetic detector 1 illustrated in FIGS. 1, 5, and 6, when no external magnetic field is applied, the first output (OUT1) and the second output (OUT2) are adjusted to be half the power supply voltage, and thus the output from a differential amplifier 3 is 0 V.

When an external magnetic field is applied in the (+) direction, the electrical resistances of the first magnetoresistance effect element layer 11 and the fourth magnetoresistance effect element layer 14 increase, whereas the electrical resistances of the first pinned resistance element layer 23 and the second pinned resistance element layer 24 remain constant, as illustrated in FIG. 5. Thus, the voltage of the first output (OUT1) decreases, the voltage of the second output (OUT2) increases, and a negative value, which is a voltage difference between the first output (OUT1) and the second output (OUT2), is output from the differential amplifier 3.

When an external magnetic field is applied in the (−) direction, the electrical resistances of the first magnetoresistance effect element layer 11 and the fourth magnetoresistance effect element layer 14 decrease, whereas the electrical resistances of the first pinned resistance element layer 23 and the second pinned resistance element layer 24 remain constant, as illustrated in FIG. 5. Thus, the voltage of the first output (OUT1) increases, the voltage of the second output (OUT2) decreases, and a positive value, which is a voltage difference between the first output (OUT1) and the second output (OUT2), is output from the differential amplifier 3. In this way, an external magnetic field is detected.

Figure 7:
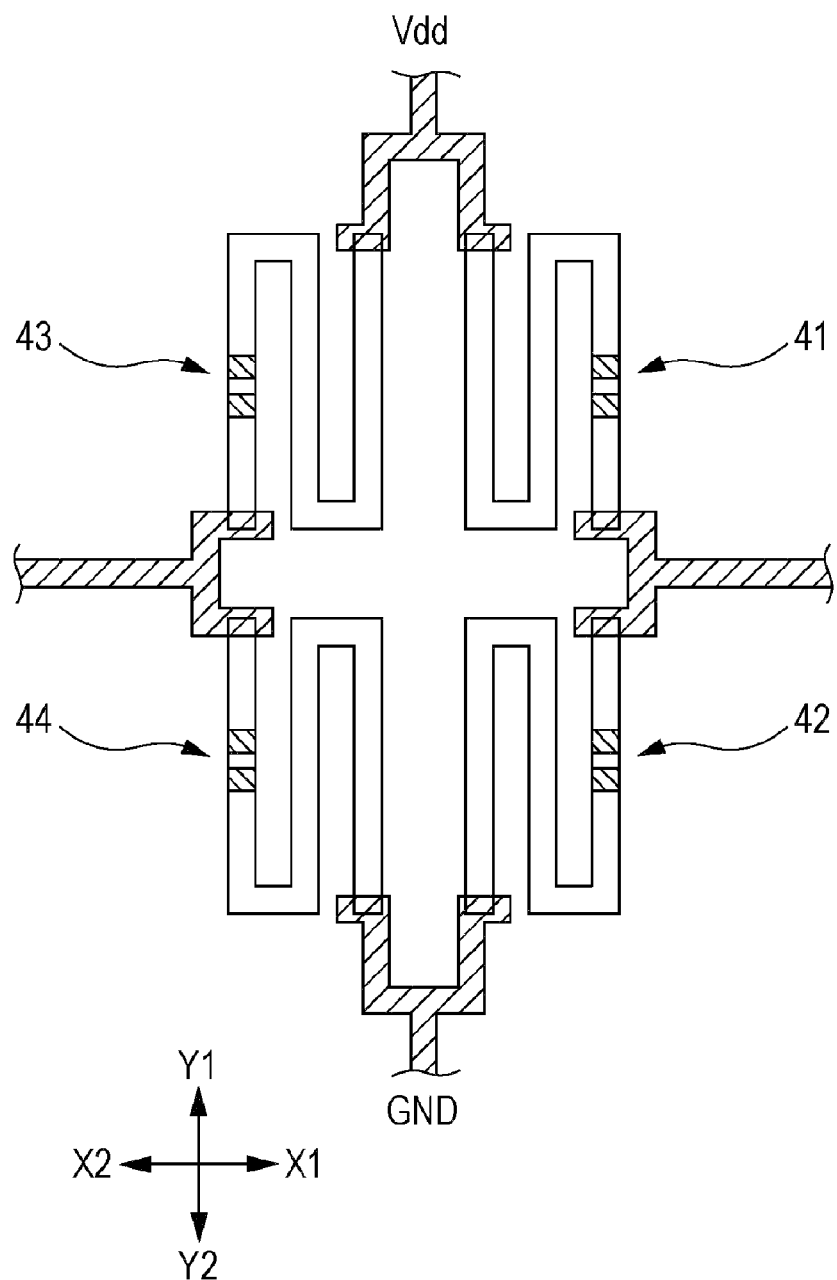
FIG. 7 is a schematic plan view illustrating a modification of the magnetic detector according to the first embodiment.

In the first embodiment, each of the first short-circuit layer 41, the second short-circuit layer 42, the third short-circuit layer 43, and the fourth short-circuit layer 44 is a single continuous solid element, but the present invention is not limited thereto. Each of the first short-circuit layer 41, the second short-circuit layer 42, the third short-circuit layer 43, and the fourth short-circuit layer 44 may be constituted by a plurality of continuous solid elements. FIG. 7 illustrates a modification of the first embodiment, in which each of the first short-circuit layer 41, the second short-circuit layer 42, the third short-circuit layer 43, and the fourth short-circuit layer 44 is constituted by two continuous solid elements.

Second Embodiment

Figure 16:
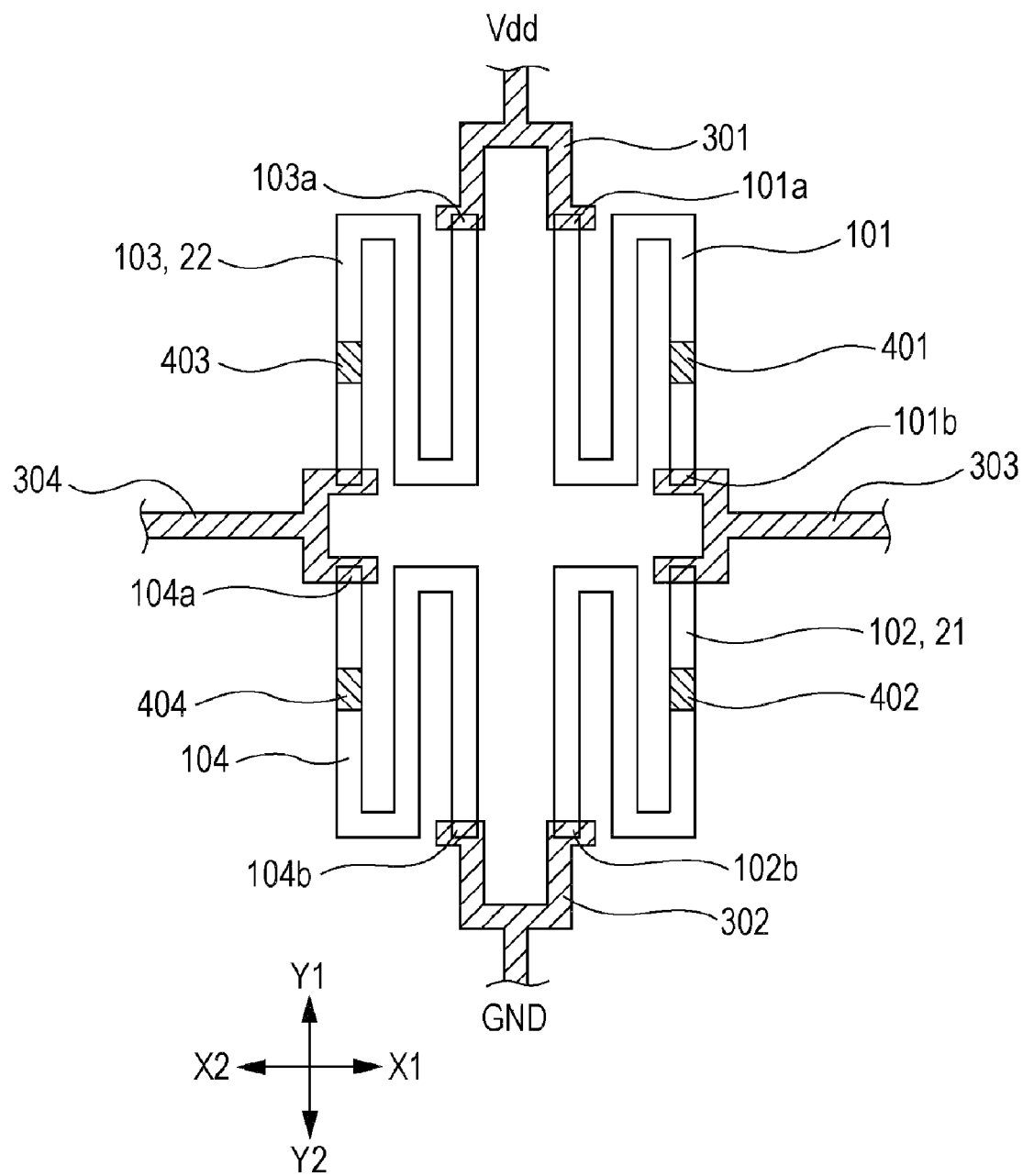
FIG. 16 is a schematic plan view of a magnetic detector according to a second embodiment.
Figure 17:
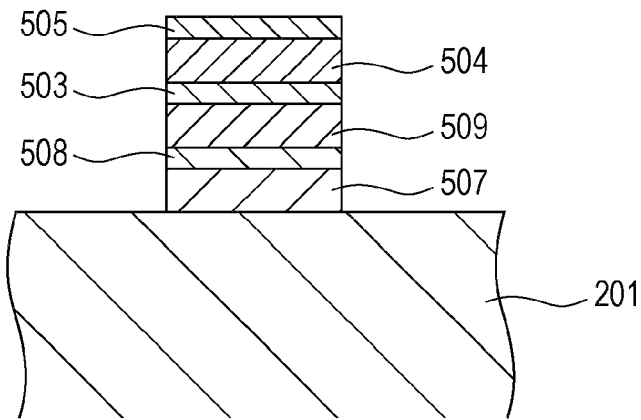
FIG. 17 is a schematic cross-sectional view of a magnetoresistance effect element layer according to the second embodiment.

In the second embodiment, as illustrated in FIG. 16, the first resistance element layer 21 is a second magnetoresistance effect element layer 102, and the second resistance element layer 22 is a third magnetoresistance effect element layer 103. The film structure of the second magnetoresistance effect element layer 102 and the third magnetoresistance effect element layer 103 is basically the same as the film structure of a first magnetoresistance effect element layer 101 and a fourth magnetoresistance effect element layer 104. As illustrated in FIG. 17, a first ferromagnetic layer 507, an anti-parallel coupling layer 508, a second ferromagnetic layer 509, a nonmagnetic conductive layer 503, a free magnetic layer 504, and a protective layer 505 are stacked in this order from a substrate 201 side.

The first ferromagnetic layer 507 is formed of an Fe—Co alloy (iron-cobalt alloy) or the like, the anti-parallel coupling layer 508 is formed of Ru (ruthenium) or the like, and the second ferromagnetic layer 509 is formed of a Co—Fe alloy (cobalt-iron alloy) or the like. The nonmagnetic conductive layer 503 is formed of Cu (copper) or the like, the free magnetic layer 504 is formed of an Ni—Fe alloy (nickel-iron alloy) or the like, and the protective layer 505 is formed of Ta (tantalum) or the like.

The magnetization direction of the second ferromagnetic layer 509 in the first magnetoresistance effect element layer 101 and the fourth magnetoresistance effect element layer 104 is pinned in the (−) direction, that is, in X2 direction. On the other hand, the magnetization direction of the second ferromagnetic layer 509 in the second magnetoresistance effect element layer 102 and the third magnetoresistance effect element layer 103 is pinned in the (+) direction, that is, in X1 direction.

Figure 18:
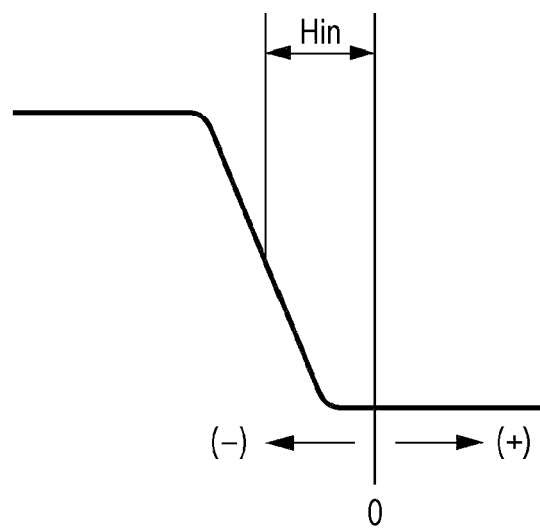
FIG. 18 is a characteristic diagram illustrating a characteristic of a magnetoresistance effect element layer in which electrical resistance decreases in the positive direction in a magnetic field.

FIG. 18 is a characteristic diagram illustrating a characteristic of a magnetoresistance effect element layer in which electrical resistance decreases in the positive direction in a magnetic field. The vertical axis indicates electrical resistance, and the horizontal axis indicates the strength and direction of a magnetic field. Regarding the directions of the magnetic field, X1 direction is represented by (+) and X2 direction is represented by (−). The electrical resistance does not change when an external magnetic field acts in the (+) direction, that is, in X1 direction. When a magnetic field is applied in the (−) direction, that is, in X2 direction, and when the strength of the magnetic field decreases to be a certain value or less, the electrical resistance increases. The magnetic field strength in the center region of the range from the maximum electrical resistance to the minimum electrical resistance is represented by Hin. The electrical resistances of the second magnetoresistance effect element layer 102 and the third magnetoresistance effect element layer 103 change in the same manner as that in this characteristic diagram.

In the first magnetoresistance effect element layer 101 and the fourth magnetoresistance effect element layer 104, the magnetization direction of the second ferromagnetic film 509 is pinned in the (−) direction. Thus, the electrical resistances of the first magnetoresistance effect element layer 101 and the fourth magnetoresistance effect element layer 104 change in the same manner as that in the characteristic diagram illustrated in FIG. 4.

A plurality of magnetoresistance effect element layers including second ferromagnetic layers 509 having different magnetization directions can be formed on the same substrate 201 in the following manner. With the above-described film structure, a so-called self-pinned ferromagnetic pinned layer (synthetic-ferri-pinned (SFP) layer) is constituted, in which the first ferromagnetic layer 507 and the second ferromagnetic layer 509 are coupled to each other via the anti-parallel coupling layer 508 in an antiferromagnetic manner.

By applying a magnetic field to the first ferromagnetic layer 507 and the second ferromagnetic layer 509 in the width direction of stripes of a meander shape during deposition of the first ferromagnetic layer 507 and the second ferromagnetic layer 509, induced magnetic anisotropy is applied to both the first ferromagnetic layer 507 and the second ferromagnetic layer 509 after the deposition. Accordingly, both the layers 507 and 509 are magnetized in antiparallel with the width direction of the stripes. Also, the magnetization direction of both the layers 507 and 509 is determined by the direction in which a magnetic field is applied during deposition of the first ferromagnetic layer 507. Thus, by changing the direction in which a magnetic field is applied during deposition of the first ferromagnetic layer 507, a plurality of magnetoresistance effect element layers including ferromagnetic pinned layers having different magnetization directions can be formed on the same substrate 201.

A first short-circuit layer 401 is electrically connected to one of the first magnetoresistance effect element layer 101 and the first pinned resistance element layer 102 having a lower electrical resistance and is disposed in a certain range of the one of the first magnetoresistance effect element layer 101 and the first pinned resistance element layer 102 having a lower electrical resistance. Also, a second short-circuit layer 402 is electrically connected to the other of the first magnetoresistance effect element layer 101 and the first pinned resistance element layer 102 having a higher electrical resistance and is disposed in a certain range of the other of the first magnetoresistance effect element layer 101 and the first pinned resistance element layer 102 having a higher electrical resistance. This is the same in the third magnetoresistance effect element layer 103 and the fourth magnetoresistance effect element layer 104. In this way, as in the first embodiment, adjustment is performed so that the potentials of the first output conductive layer 303 and the second output conductive layer 304 are half the power supply voltage when no external magnetic field is applied, that is, when the value of an external magnetic field is 0 Oe.

Figure 19:
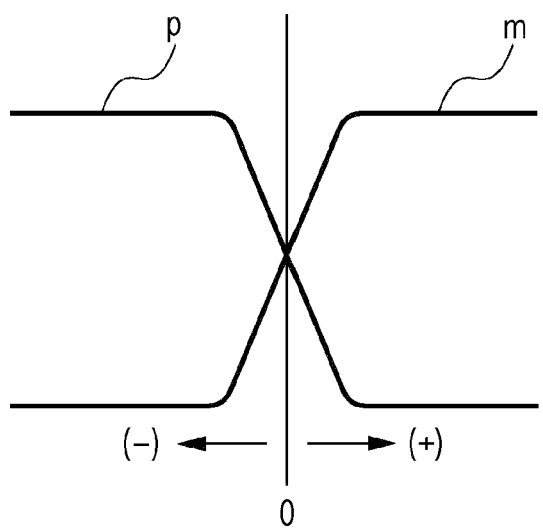
FIG. 19 is a characteristic diagram illustrating characteristics of a first magnetoresistance effect element layer and a fourth magnetoresistance effect element layer and characteristics of a second magnetoresistance effect element layer and a third magnetoresistance effect element layer.

FIG. 19 is a characteristic diagram illustrating characteristics (m) of the first magnetoresistance effect element layer 101 and the fourth magnetoresistance effect element layer 104 and characteristics (p) of the second magnetoresistance effect element layer 102 and the third magnetoresistance effect element layer 103. In the first magnetoresistance effect element layer 101, the fourth magnetoresistance effect element layer 104, the second magnetoresistance effect element layer 102, and the third magnetoresistance effect element layer 103, Hin is adjusted to be 0 Oe by using a bias magnetic field component of the outer permanent magnet layer, as in the first embodiment, although not illustrated.

Figure 20:
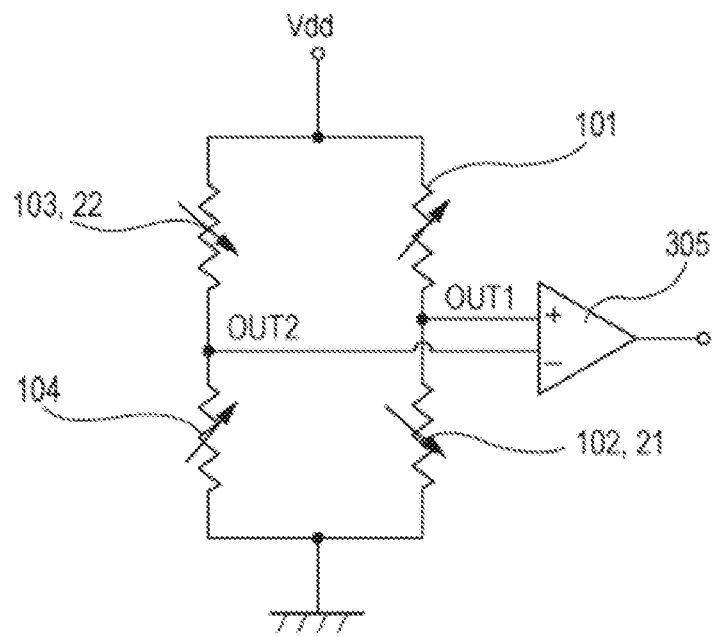
FIG. 20 is a schematic circuit diagram of the magnetic detector according to the second embodiment.
Figure 21:
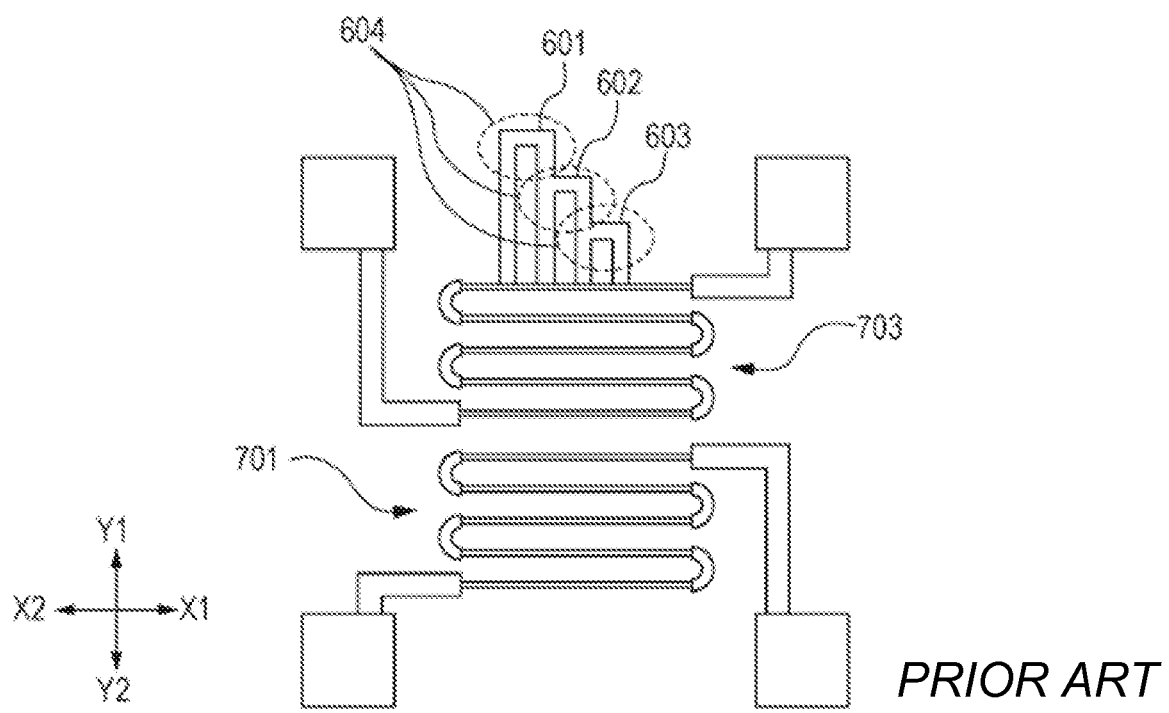
FIG. 21 is a schematic plan view of a magnetic detector disclosed in Japanese Unexamined Patent Application Publication No. 2008-46076.

In the magnetic detector illustrated in FIGS. 16, 19, and 20, when no external magnetic field is applied, the first output (OUT1) and the second output (OUT2) are adjusted to be half the power supply voltage, and thus the output from a differential amplifier 305 is 0 V. When an external magnetic field is applied in the (+) direction, the electrical resistances of the first magnetoresistance effect element layer 101 and the fourth magnetoresistance effect element layer 104 increase, and the electrical resistances of the second magnetoresistance effect element layer 102 and the third magnetoresistance effect element layer 103 decrease, as illustrated in FIG. 19. As a result, the voltage of the first output (OUT1) decreases, the voltage of the second output (OUT2) increases, and the differential amplifier 305 outputs a negative voltage, which is a difference in voltage between the first output (OUT1) and the second output (OUT2).

When an external magnetic field is applied in the (−) direction, the electrical resistances of the first magnetoresistance effect element layer 101 and the fourth magnetoresistance effect element layer 104 decrease, and the electrical resistances of the second magnetoresistance effect element layer 102 and the third magnetoresistance effect element layer 103 increase, as illustrated in FIG. 19. As a result, the voltage of the first output (OUT1) increases, the voltage of the second output (OUT2) decreases, and the differential amplifier 305 outputs a positive voltage, which is a difference in voltage between the first output (OUT1) and the second output (OUT2).

In this case, the electrical resistances of the first magnetoresistance effect element layer 101, the second magnetoresistance effect element layer 102, the third magnetoresistance effect element layer 103, and the fourth magnetoresistance effect element layer 104 are represented by R11, R12, R13, and R14, respectively, and the power supply voltage is represented by Vdd, as illustrated in FIG. 20. Then, the following expressions are given.

First output(OUT1)=$R12 \times Vdd/(R11+R12)$

Second output(OUT2)=$R14 \times Vdd/(R13+R14)$

The first magnetoresistance effect element layer 101 and the fourth magnetoresistance effect element layer 104 are formed in the same manner, and also the second magnetoresistance effect element layer 102 and the third magnetoresistance effect element layer 103 are formed in the same manner. Therefore, basically, R11=R14 and R12=R13.

Thus, the following expression is satisfied.

First output(OUT1)−second output(OUT2)

=$R12 \times Vdd/(R11+R12) - R14 \times Vdd/(R13+R14)$

=$(R12-R11) \times Vdd/(R11+R12)$

=$(R13-R14) \times Vdd/(R13+R14)$

Therefore, the voltage output from the differential amplifier 305 is proportional to a difference in electrical resistance between the second magnetoresistance effect element layer 102 and the first magnetoresistance effect element layer 101, or is proportional to a difference in electrical resistance between the third magnetoresistance effect element layer 103 and the fourth magnetoresistance effect element layer 104. This is the same in the first embodiment. In the first embodiment, the voltage output from the differential amplifier 3 is proportional to a difference in electrical resistance between the first pinned resistance element layer 23 and the first magnetoresistance effect element layer 11, or is proportional to a difference in electrical resistance between the second pinned resistance element layer 24 and the fourth magnetoresistance effect element layer 14.

As can be seen in the comparison between FIGS. 5 and 19, the electrical resistances of the first pinned resistance element layer 23 and the second pinned resistance element layer 24 remain constant in response to an external magnetic field, whereas the electrical resistances of the second magnetoresistance effect element layer 102 and the third magnetoresistance effect element layer 103 change in the direction opposite to the electrical resistances of the first magnetoresistance effect element layer 101 and the fourth magnetoresistance effect element layer 104. Thus, the output from the differential amplifiers 3 and 305 is larger in the second embodiment than in the first embodiment.

What is claimed is:

1. A magnetic detector comprising:
a first magnetoresistance effect element layer having an electrical resistance which changes in response to an external magnetic field;
a first resistance element layer connected in series to the first magnetoresistance effect element layer;
a first short-circuit layer that is conductive, the first short-circuit layer forming a short-circuit path having a first short-circuit length; and
a second short-circuit layer that is conductive, the second short-circuit layer forming a short-circuit path having a second short-circuit length,
wherein the first short-circuit layer is disposed on and electrically connected to one of the first magnetoresistance effect element layer and the first resistance element layer,
wherein the second short-circuit layer is disposed on and electrically connected to the other of the first magnetoresistance effect element layer, and
wherein a difference between the first short-circuit length and the second short-circuit length adjusts a difference between the electrical resistance of the first magnetoresistance effect element layer and an electrical resistance of the first resistance element layer.

2. The magnetic detector according to claim 1, wherein the difference between the first short-circuit length and the second short-circuit length compensates the difference between the electrical resistance of the first magnetoresistance effect element layer and the electrical resistance of the first resistance element layer.

3. The magnetic detector according to claim 1, wherein the first resistance element layer is a first pinned resistance element layer having an electrical resistance which does not change in response to an external magnetic field.

4. The magnetic detector according to claim 1, wherein the first resistance element layer is a second magnetoresistance effect element layer having an electrical resistance which increases or decreases in response to an external magnetic field in an opposite manner to the electrical resistance of the first magnetoresistance effect element layer.

5. The magnetic detector according to claim 1, wherein the first short-circuit layer is disposed in a location a certain distance away from both ends of one of the first magnetoresistance effect element layer and the first resistance element layer in a longitudinal direction.

6. The magnetic detector according to claim 1, wherein the second short-circuit layer is disposed in a location a certain distance away from both ends of the other of the first magnetoresistance effect element layer and the first resistance element layer in a longitudinal direction.

7. The magnetic detector according to claim 1,
wherein the second short-circuit length is greater than the first short-circuit length, the second short-circuit layer being disposed on one of the first magnetoresistance effect element layer and the first resistance element layer which has a higher electrical resistance than the other, and the first short-circuit layer being disposed on the other of the first magnetoresistance effect element layer and the first resistance element layer which has a lower electrical resistance.

8. The magnetic detector according to claim 4, wherein the first magnetoresistance effect element layer and the second magnetoresistance effect element layer include:
a first pinned magnetic layer in which a magnetization direction is pinned;
a free magnetic layer in which a magnetization direction changes in response to an external magnetic field; and
a nonmagnetic conductive layer disposed between the first pinned magnetic layer and the free magnetic layer.

9. The magnetic detector according to claim 4,
wherein the electrical resistance of the first magnetoresistance effect element layer changes in response to a magnetic field in a first direction, and does not change in response to a magnetic field in a second direction opposite to the first direction, and
wherein the electrical resistance of the second magnetoresistance effect element layer changes in response to a magnetic field in the second direction, and does not change in response to a magnetic field in the first direction.

10. The magnetic detector according to claim 3, wherein the first pinned resistance element layer includes:
a first pinned magnetic layer in which a magnetization direction is pinned;
a nonmagnetic conductive layer having a low resistivity resistivity; and
a second pinned magnetic layer disposed between the first pinned magnetic layer and the nonmagnetic conductive layer.

11. The magnetic detector according to claim 1, further comprising:
a second resistance element layer disposed in parallel with the first magnetoresistance effect element layer;
a fourth magnetoresistance effect element layer connected in series to the second resistance element layer;
a third short-circuit layer that is conductive, disposed on and electrically connected to one of the fourth magnetoresistance effect element layer and the second resistance element layer; and
a fourth short-circuit layer that is conductive, disposed on and electrically connected to the other of the fourth magnetoresistance effect element layer and the second resistance element layer,
wherein the first magnetoresistance effect element layer, the first resistance element layer, the second resistance element layer, and the fourth magnetoresistance effect element layer constitute a bridge circuit.

12. A method for manufacturing a magnetic detector including:
a first magnetoresistance effect element layer having an electrical resistance which changes in response to an external magnetic field;
a first resistance element layer connected in series to the first magnetoresistance effect element layer;
a first short-circuit layer that is conductive, disposed on and electrically connected to one of the first magnetoresistance effect element layer and the first resistance element layer so as to form a short-circuit path;
a second short-circuit layer that is conductive, disposed on and electrically connected to the other of the first magnetoresistance effect element layer and the first resistance element layer so as to form a short-circuit path,
the method comprising:
(a) forming the first magnetoresistance effect element layer and the first resistance element layer;
(b) measuring respective electrical resistances of the first magnetoresistance effect element layer and the first resistance element layer, and determining a difference between the electrical resistances, the difference being caused by variations of a process; and
(c) adjusting the electrical resistances of the first magnetoresistance effect element layer and the first resistance element layer by:
disposing the second short-circuit layer on a selected location of one of the first magnetoresistance effect element layer and the first resistance element layer which has a higher electrical resistance than the other; and
disposing the first short-circuit layer on a selected location of the other of the first magnetoresistance effect element layer and the first resistance element layer which has a lower electrical resistance.

13. The method according to claim 12, wherein (c) adjusting the electrical resistance includes:
applying a resist onto the first magnetoresistance effect element layer and the first resistance element layer;
providing a reticle having individual certain patterns of the first short-circuit layer and the second short-circuit layer; and
exposing the individual certain patterns simultaneously through the reticle.

14. The magnetic detector according to claim 1,
wherein the first short-circuit layer is disposed on a certain portion of the one of the first magnetoresistance effect element layer and the first resistance element layer such that the first short-circuit length is defined along a longitudinal direction of the one of the first magnetoresistance effect element layer and the first resistance element layer, and
wherein the second short-circuit layer is disposed on a certain portion of the other of the first magnetoresistance effect element layer and the first resistance element layer such that the second short-circuit length is defined along a longitudinal direction of the other of the first magnetoresistance effect element layer and the first resistance element layer.

15. The magnetic detector according to claim 11,
wherein the third short-circuit layer and the forth short-circuit layer form respective short-circuit paths having a third short-circuit length and a fourth short-circuit length, respectively, and
wherein a difference between the third short-circuit length and the fourth short-circuit length adjusts a difference between an electrical resistance of the second resistance element layer and an electrical resistance of the fourth magnetoresistance effect element layer.

16. A magnetic detector comprising:

a first magnetoresistance effect element layer having a first electrical resistance which changes in response to an external magnetic field;

a first resistance element layer connected in series to the first magnetoresistance effect element layer, the first resistance element having a second electrical resistance;

a first short-circuit layer disposed on and electrically connected to the first magnetoresistance effect element layer, the first short-circuit layer having a first short-circuit length along a longitudinal direction of the first mangetoresistance effect layer to adjust the first electrical resistance; and a second short-circuit layer disposed on and electrically connected to the first resistance element layer, the second short-circuit layer having a second short-circuit length along a longitudinal direction of the first resistance element layer to adjust the second electric resistance, wherein a difference between the first short-circuit length and the second short-circuit length compensates a difference between the first electrical resistance of the first magnetoresistance effect element layer and the second electrical resistance of the first resistance element layer.

17. The magnetic detector according to claim 16, wherein the second short-circuit length is greater than the first short-circuit length if the second electric resistance is greater than the first electric resistance, and the first short-circuit length is greater than the second short-circuit length if the first electric resistance is greater than the second electric resistance.

* * * * *